(12) United States Patent
Maekawa et al.

(10) Patent No.: US 8,963,272 B2
(45) Date of Patent: Feb. 24, 2015

(54) PHOTOELECTRIC CONVERTER HAVING CHALCOPYRITE COMPOUND SEMICONDUCTOR LAYER PARTITIONED INTO PIXELS AND SHIELDING LAYER ARRANGED AROUND EACH PIXEL

(71) Applicant: Rohm Co., Ltd., Kyoto (JP)

(72) Inventors: Takuji Maekawa, Kyoto (JP); Osamu Matsushima, Kyoto (JP); Toshihisa Maeda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/918,042

(22) Filed: Jun. 14, 2013

(65) Prior Publication Data
US 2013/0341694 A1  Dec. 26, 2013

(30) Foreign Application Priority Data

Jun. 14, 2012 (JP) .................................. 2012-135088
Aug. 20, 2012 (JP) .................................. 2012-181896

(51) Int. Cl.
| H01L 27/146 | (2006.01) |
| --- | --- |
| H01L 31/0264 | (2006.01) |
| H01L 31/0216 | (2014.01) |
| H01L 31/0224 | (2006.01) |
| H01L 31/032 | (2006.01) |

(52) U.S. Cl.
CPC .... *H01L 27/14623* (2013.01); *H01L 31/02164* (2013.01); *H01L 31/022466* (2013.01); *H01L 31/0322* (2013.01); *H01L 27/14609* (2013.01)
USPC ............................................................ 257/435

(58) Field of Classification Search
CPC .............................................. H01L 31/022475
See application file for complete search history.

(56) References Cited

U.S. PATENT DOCUMENTS

| 2011/0180688 A1 | 7/2011 | Nakahara |
| --- | --- | --- |
| 2011/0197967 A1 | 8/2011 | Kaijo et al. |
| 2011/0205412 A1 | 8/2011 | Miyazaki et al. |

FOREIGN PATENT DOCUMENTS

| JP | 2010-098264 A | 4/2010 |
| --- | --- | --- |
| JP | 2011-151271 A | 8/2011 |
| JP | 2011-171646 A | 9/2011 |

*Primary Examiner* — Stephen W Smoot
(74) *Attorney, Agent, or Firm* — Rabin & Berdo, P.C.

(57) ABSTRACT

A photoelectric converter according to the present invention includes a substrate, a lower electrode layer arranged on the substrate, a compound semiconductor layer of a chalcopyrite structure arranged on the lower electrode layer to cover the lower electrode layer and partitioned into a plurality of pixels, a transparent electrode layer arranged on the compound semiconductor layer, and a shielding layer arranged around each of the pixels on the compound semiconductor layer.

26 Claims, 16 Drawing Sheets

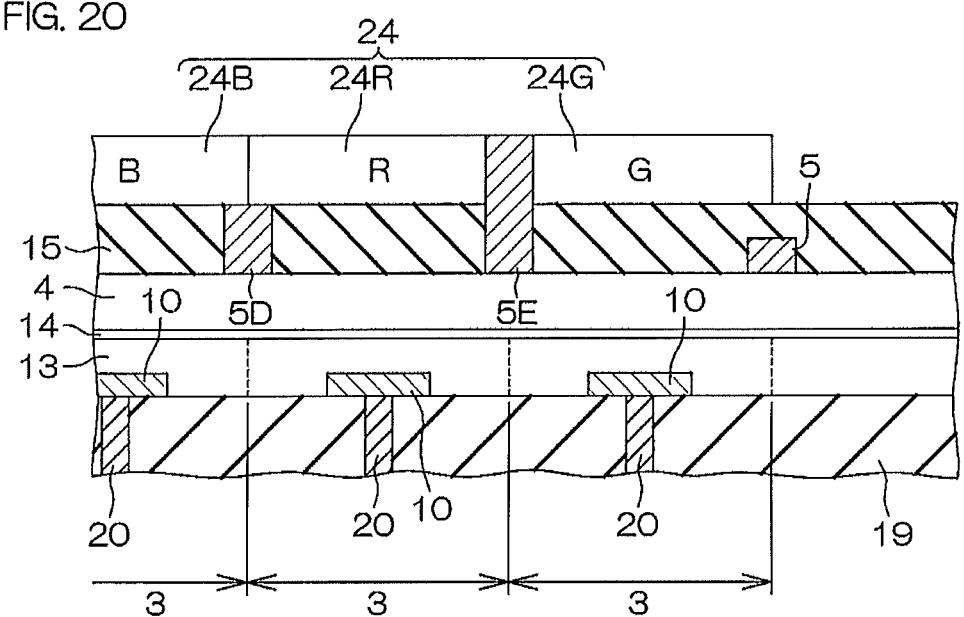

PHOTOELECTRIC CONVERTER HAVING CHALCOPYRITE COMPOUND SEMICONDUCTOR LAYER PARTITIONED INTO PIXELS AND SHIELDING LAYER ARRANGED AROUND EACH PIXEL

BACKGROUND OF THE INVENTION

1. Field of the Invention

The present invention relates to a photoelectric converter having a compound semiconductor layer of a chalcopyrite structure.

2. Description of Related Art

A solid-state image sensor employing a chalcopyrite semiconductor is known in general. For example, Patent Document 1 (Japanese Unexamined Patent Publication No. 2011-141271) discloses a solid-state image sensor sensing light of the ultraviolet to visible band as well as the near-infrared band.

SUMMARY OF THE INVENTION

However, a conventional solid-state image sensor easily causes such crosstalk that light incident in the vicinity of a boundary between a pixel and another pixel adjacent thereto progresses toward the adjacent pixel beyond the boundary, to result in sensitivity dispersion between the pixels.

An object of the present invention is to provide a photoelectric converter capable of preventing the occurrence of crosstalk and reducing sensitivity dispersion between pixels.

BRIEF DESCRIPTION OF THE DRAWINGS

FIG. 20 illustrates an example of arrangement of the shielding layer.

DETAILED DESCRIPTION OF THE EMBODIMENTS

Figure 1:
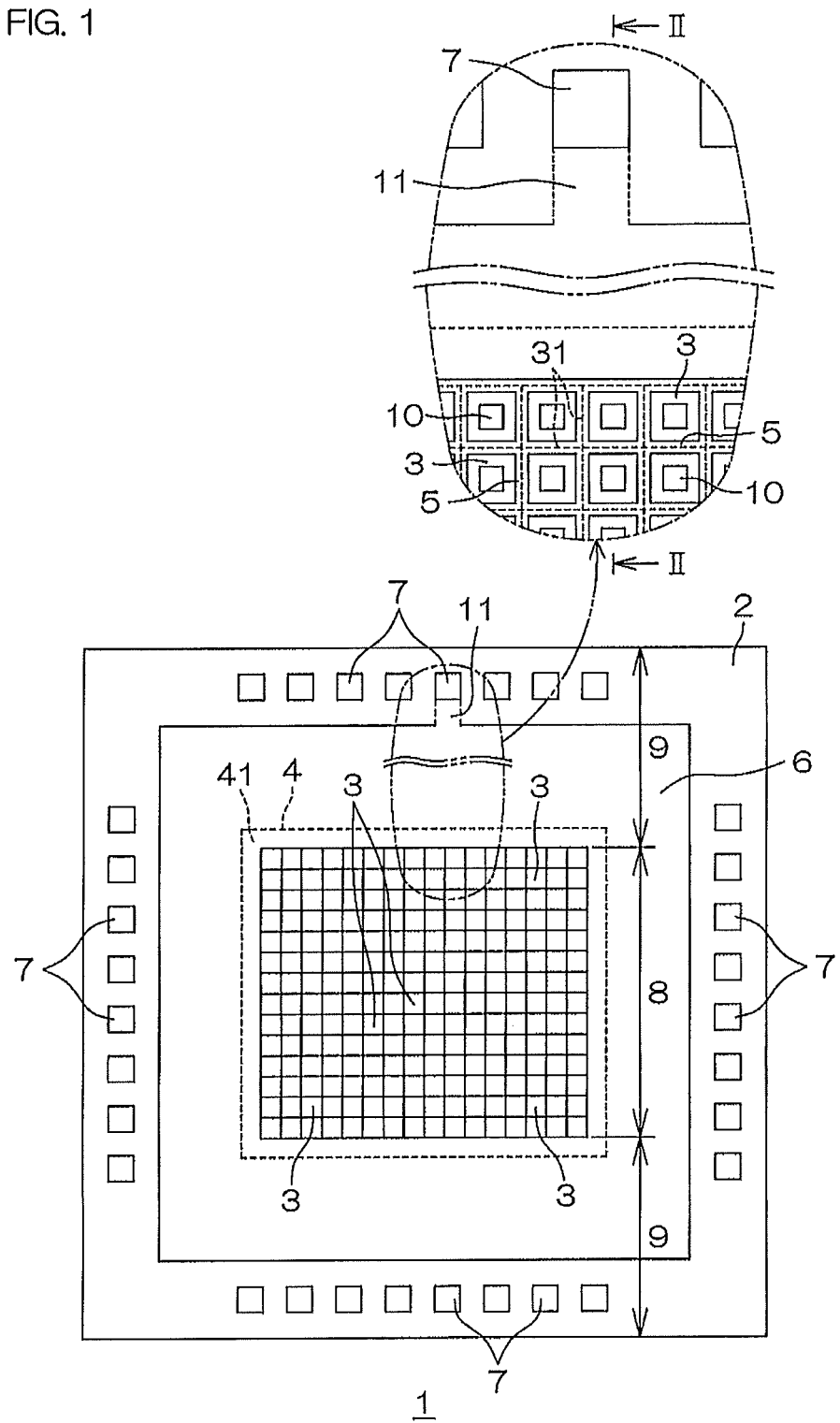
FIG. 1 is a schematic plan view of a photoelectric converter according to a first embodiment of the present invention.

A photoelectric converter according to the present invention includes a substrate, a lower electrode layer arranged on the substrate, a compound semiconductor layer of a chalcopyrite structure arranged on the lower electrode layer to cover the lower electrode layer and partitioned into a plurality of pixels, a transparent electrode layer arranged on the compound semiconductor layer, and a shielding layer arranged around each of the pixels on the compound semiconductor layer.

According to the structure, the shielding layer is arranged around each pixel. Thus, the shielding layer can block light incident in the vicinity of boundaries between the plurality of pixels. Therefore, occurrence of such crosstalk can be prevented that light incident upon each pixel proceeds toward the pixel adjacent thereto beyond the boundary therebetween. Consequently, sensitivity dispersion between the pixels of the photoelectric converter can be reduced (the pixels can be uniformized in sensitivity).

Preferably, the width of the shielding layer is 1 to 30% of the size of each of the pixels.

According to the structure, the aperture ratio of the compound semiconductor layer can be relatively increased and each pixel can obtain a sufficient signal, whereby the SN ratio (the signal-to-noise ratio) of the photoelectric converter can be improved.

Preferably, the shielding layer is made of a material blocking light having a wavelength absorbable by a compound semiconductor of a chalcopyrite structure, and more specifically, made of aluminum or black resist.

When the photoelectric converter includes a metal electrode layer made of aluminum selectively formed on the transparent electrode layer and connected to the transparent electrode layer, the shielding layer made of aluminum is preferably formed on the transparent electrode layer.

Both of the shielding layer and the metal electrode layer are made of aluminum and formed on the transparent electrode layer, whereby the shielding layer and the metal electrode layer can be formed through the same step. Consequently, manufacturing steps can be simplified.

The shielding layer may be formed over the whole periphery of a boundary between the pixels adjacent to each other in plan view. In this case, the shielding layer may have a constant width in a direction across the boundary.

When the pixels are provided in the form of quadrangles in plan view, the shielding layer may have a relatively large width on a corner portion of the boundary between the pixels, and may have a relatively small width on a side portion of the boundary between the pixels. In this case, the shielding layer may form a circular region in an inner region thereof.

The shielding layer may be selectively formed on part of a boundary between the pixels adjacent to each other in plan view. Preferably in this case, the pixels are provided in the form of quadrangles in plan view, and the shielding layer is formed only on a corner portion of the boundary between the pixels, and selectively exposes a side portion of the boundary between the pixels.

The corner portion of the boundary between the pixels is present on a position separating from the lower electrode layer in the pixels as compared with the side portion of the boundary between the pixels. Thus, light incident in the vicinity of the corner portion of the boundary more easily causes crosstalk as compared with light incident in the vicinity of the side portion of the boundary. Therefore, an effect of preventing crosstalk can be sufficiently attained by simply selectively forming the shielding layer only on the corner portion.

Preferably, the photoelectric converter further includes a microlens arranged on the transparent electrode layer.

According to the structure, the microlens can converge light incident upon each pixel on the lower electrode layer. Therefore, the signal detected by the lower electrode layer can be increased.

Preferably, the microlens overlaps the shielding layer in a lateral direction along the front surface of the substrate.

According to the structure, the microlens overlaps the shielding layer, whereby the quantity of luminous flux incident in the vicinity of the shielding layer can be reduced, and the occurrence of crosstalk can be more suppressed.

Preferably, the photoelectric converter further includes a color filter arranged on the transparent electrode layer. In this case, the photoelectric converter may further include an infrared ray filter arranged to be adjacent to the color filter.

According to the structure, the color filter and the shielding layer are so combined with each other that color mixing resulting from crosstalk can be excellently prevented.

Preferably, the photoelectric converter further includes a microlens arranged on the color filter.

According to the structure, the microlens can converge light incident upon the color filter on the lower electrode layer through the color filter. Therefore, color mixing can be more excellently prevented.

Preferably, the compound semiconductor layer is made of $Cu_y(In_xGa_{1-x})Se_2$ ($0 \leq Y \leq 1$ and $0 \leq X \leq 1$).

Preferably, the photoelectric converter includes a circuit portion arranged between the substrate and the lower electrode layer.

The circuit portion and the compound semiconductor layer are so stacked with each other that most region on the substrate can be effectively utilized as a photodetection surface. Therefore, a photoelectric converter capable of sufficiently ensuring a detection area can be designed, whereby sensitivity thereof can be improved.

The circuit portion may include a CMOS field-effect transistor.

The CMOS field-effect transistor may include a source layer and a drain layer selectively formed on a surface portion of the substrate and a gate electrode arranged between the source layer and the drain layer.

The transparent electrode layer may be made of zinc oxide (ZnO) or indium tin oxide (ITO).

The photoelectric converter may include a buffer layer arranged between the compound semiconductor layer and the transparent electrode layer.

The buffer layer may be made of CdS, ZnS, $(Cd_XZn_{1-X})S$ ($0 \leq X \leq 1$), ZnO, Zn(O, OH)S, $(Zu_ZMg_{1-Z})O$ ($0 \leq Z \leq 1$), ZnSe or $In_2S_3$.

The lower electrode layer may be made of molybdenum (Mo), niobium (Nb), tantalum (Ta) or tungsten (W).

Preferably, the compound semiconductor layer is arranged to collectively cover a plurality of lower electrode layers, and the lower electrode layers are formed by tungsten layers or molybdenum layers having a thickness of 50 nm to 200 nm.

According to the structure, the thickness of the lower electrode layers is 50 nm to 200 nm, whereby a step between the lower electrode layers and the substrate can be reduced. Therefore, an undepleted range in the compound semiconductor layer can be reduced. Consequently, crosstalk can be suppressed.

Further, the compound semiconductor layer collectively covers the lower electrode layers, and is not separated every pixel. Therefore, no working for pixel separation may be performed when manufacturing the photoelectric converter, whereby manufacturing steps can be simplified. Further, the compound semiconductor layer can be prevented from damage resulting from such working. In addition, the thickness of the lower electrode layer can be reduced to 50 nm to 200 nm, whereby a step between the compound semiconductor layer and the transparent electrode layer can be reduced. Consequently, formation of void defects can be suppressed in the space between the compound semiconductor layer and the transparent electrode layer. As a result, generation of dark current can be suppressed.

Preferably, the photoelectric converter further includes an insulating film arranged between the substrate and the lower electrode layer, the compound semiconductor layer is arranged to collectively cover a plurality of lower electrode layers, and the lower electrode layers are formed by tungsten layers embedded in the insulating film.

According to the structure, the lower electrode layers are embedded in the insulating film, whereby a step between the lower electrode layers and the insulating film can be reduced as compared with a case where the lower electrode layers are formed on the front surface of the insulating film. Therefore, an undepleted range in the compound semiconductor layer can be reduced. Consequently, crosstalk can be suppressed.

Further, the compound semiconductor layer collectively covers the lower electrode layers, and is not separated every pixel. Therefore, no working for pixel separation may be performed when manufacturing the photoelectric converter, whereby manufacturing steps can be simplified. Further, the compound semiconductor layer can be prevented from damage resulting from such working. In addition, the lower electrode layers are embedded in the insulating film, whereby a step between the compound semiconductor layer and the transparent electrode layer can be reduced. Consequently, formation of void defects can be suppressed in the space between the compound semiconductor layer and the transparent electrode layer. As a result, generation of dark current can be suppressed.

The lower electrode layers may be completely embedded in the insulating film, so that the upper surfaces thereof are flush with the front surface of the insulating film.

According to the structure, the compound semiconductor layer can be completely depleted, whereby crosstalk can be reliably prevented. Further, the space between the compound semiconductor layer and the transparent electrode layer can be planarized, whereby formation of void defects can be more excellently suppressed in the space between the compound semiconductor layer and the transparent electrode layer.

The lower electrode layers may be completely embedded in the insulating film, so that the upper surfaces thereof are lower than the front surface of the insulating film.

Also according to the structure, the compound semiconductor layer can be completely depleted, whereby crosstalk can be reliably prevented.

Preferably, the lower electrode layers have a thickness of 50 nm to 200 nm.

Embodiments of the present invention are now described in detail with reference to the attached drawings.

FIG. 1 is a schematic plan view of a photoelectric converter according to a first embodiment of the present invention.

A photoelectric converter 1 detects incident light, and converts the energy of the light to an electric signal.

The photoelectric converter 1 includes a substrate 2, a plurality of pixels 3, a transparent electrode layer 4, a shielding layer 5, a metal electrode layer 6, and a plurality of pads 7.

The substrate 2 is made of silicon (Si), for example. The substrate 2 is 5 mm by 10 mm, for example. A light receiving region 8 is formed on a central portion of the substrate 2, and a peripheral region 9 is formed to surround the light receiving region 8. The substrate 2 has a thickness of 400 μm to 1000 μm, for example.

According to the first embodiment, the plurality of pixels 3 are arrayed in the form of a matrix (in rows and columns) on the light receiving region 8. Lower electrode layers 10 are arranged one by one on the pixels 3 respectively. The transparent electrode layer 4 is arranged on the pixels 3, to collectively cover the pixels 3 arrayed in the form of a matrix.

The shielding layer 5 is made of aluminum (Al), for example. The shielding layer 5 is arranged on the periphery of each pixel 3 in plan view, and annularly formed to surround each pixel 3 according to the first embodiment.

The metal electrode layer 6 is made of aluminum (Al), for example. The metal electrode layer 6 is annularly formed to surround the transparent electrode layer 4 in the peripheral region 9, and covers a peripheral edge portion 41 of the transparent electrode layer 4. Thus, the metal electrode layer 6 is connected to the peripheral edge portion 41 of the transparent electrode layer 4.

The plurality of pads 7 are arranged on regions separating from the metal electrode layer 6 at intervals from one another. According to the first embodiment, the plurality of pads 7 are linearly arrayed along the respective sides of the substrate 2. Some of the plurality of pads 7 (may be one or not less than two) are connected to the metal electrode layer 6 through a pad connection portion 11 formed integrally with the metal electrode layer 6. The pad connection portion 11 is formed to extend between the pad(s) 7 and the metal electrode layer 6.

Figure 2:
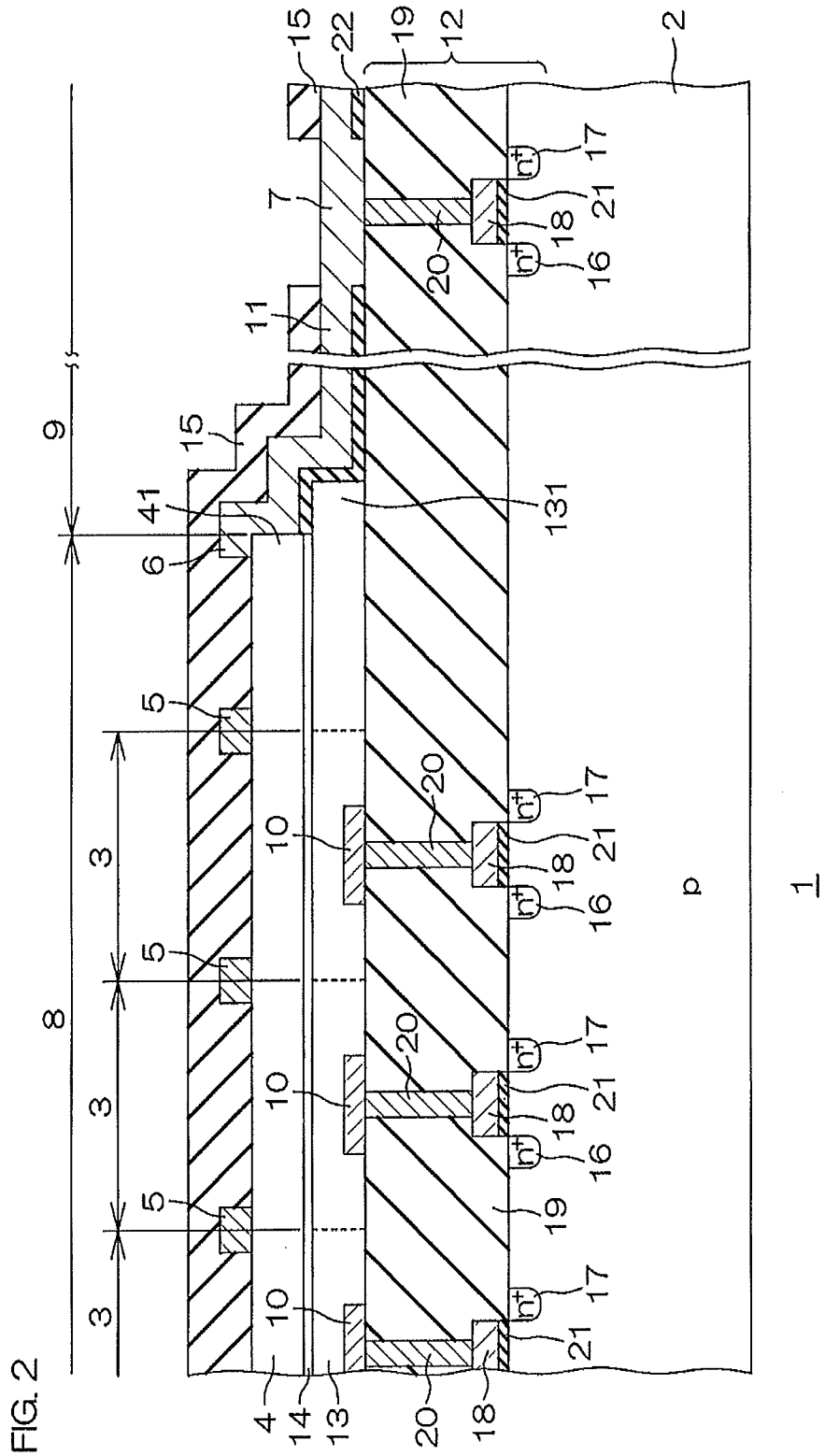
FIG. 2 is a cross sectional view taken along a cutting plane line II-II in FIG. 1.
Figure 3A:
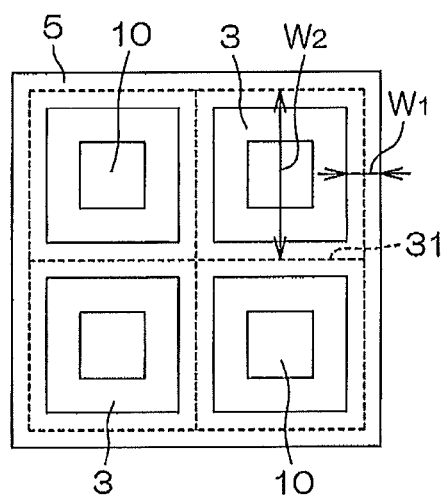
FIGS. 3A to 3C illustrate examples of a plane shape of a shielding layer.
Figure 3B:
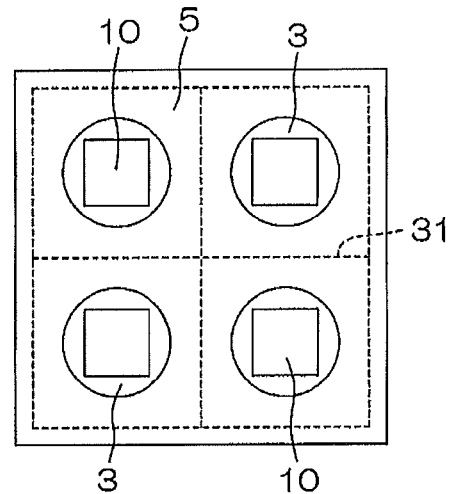
Figure 3C:
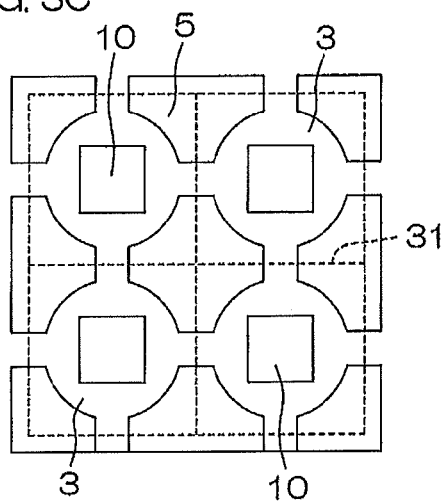
Figure 4:
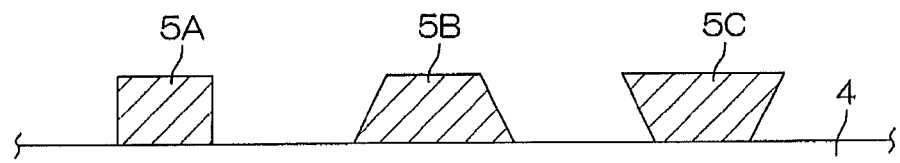
FIG. 4 illustrates examples of the sectional shape of the shielding layer.

The sectional structure of the photoelectric converter 1 is now described. FIG. 2 is a cross sectional view taken along a cutting plane line II-II in FIG. 1. FIGS. 3A to 3C illustrate examples of a plane shape of the shielding layer 5. FIG. 4 illustrates examples of the sectional shape of the shielding layer 5.

The photoelectric converter 1 includes a circuit portion 12, the lower electrode layers 10, a compound semiconductor layer 13, a buffer layer 14, the transparent electrode layer 4, the metal electrode layer 6, the shielding layer 5 and a surface protective film 15 successively stacked on the substrate 2.

The circuit portion 12 includes a CMOS field-effect transistor, for example. FIG. 2 shows a plurality of n-channel MOS transistors partially constituting the CMOS field-effect transistor in the circuit portion 12. The n-channel MOS transistors include source layers 16 and drain layers 17 selectively formed on a surface portion of the substrate 2, gate electrodes 18 arranged between the source layers 16 and the drain layers 17, an interlayer film 19 formed on the substrate 2 to cover the gate electrodes 18, and via electrodes 20 passing through the interlayer film 19. Gate insulating films 21 are arranged between the gate electrodes 18 and the substrate 2.

Some of the via electrodes 20 (may be one or not less than two) connect the lower electrode layers 10 and the gate electrodes 18 with one another. The lower electrode layers 10 (anodes) are connected to the gate electrodes 18, whereby the n-channel MOS transistors amplify light information (the electric signal) detected by the compound semiconductor layer 13. The remaining ones of the via electrodes 20 (may be one or not less than two) connect the pads 7 and the gate electrodes 18 with one another. Thus, the metal electrode layer 6 is electrically connected to the circuit portion 12 in the peripheral region 9. The structure of the circuit portion 12 shown in FIG. 2 is a mere example. Alternatively, the circuit portion 12 may be a thin-film transistor of a CMOS structure formed on a thin film provided on a glass substrate, for example.

The plurality of lower electrode layers 10 are arrayed on the interlayer film 19 in the form of a matrix. The lower electrode layers 10 are made of molybdenum (Mo), niobium (Nb), tantalum (Ta) or tungsten (W), for example. Preferably, the lower electrode layers 10 are made of tungsten (W) or molybdenum (Mo) among the materials, and the thickness thereof is 50 nm to 200 nm.

Tungsten (W) has higher reflectance than the remaining materials, and hence the compound semiconductor layer 13 can detect not only light incident thereupon, but also light reflected by the lower electrode layers 10 when the lower electrode layers 10 are made of tungsten. Further, tungsten (W) can be easily worked through an LSI manufacturing technique, and hence the size of the lower electrode layers 10 can be easily controlled when the lower electrode layers 10 are made of tungsten.

On the other hand, molybdenum (Mo) forms $MoSe_2$, and hence CIGS can be formed with excellent adhesiveness and matching property when the lower electrode layers 10 are made of molybdenum, although the number of manufacturing steps is increased in this case. Therefore, dark current can be effectively reduced.

The lower electrode layers 10 may be formed integrally with the via electrodes 20. In order to form such a structure, via holes for receiving the via electrodes 20 therein are first formed by etching the interlayer film 19, for example. Then, a tungsten material is deposited on the interlayer film 19 by CVD (Chemical Vapor Deposition), to fill up the via holes. Alternatively, a film of a molybdenum material is formed by sputtering. Then, the front surface of the tungsten material or the molybdenum material is polished by CMP (Chemical Mechanical Polishing), to reach a prescribed thickness. The lower electrode layers 10 integral with the via electrodes 20 can be formed by thereafter etching the tungsten layer or the molybdenum layer.

The compound semiconductor layer 13 is formed to collectively cover the plurality of lower electrode layers 10, and partitioned into the plurality of pixels 3. The compound semiconductor layer 13 preferably has a thickness of 0.1 μm to 2 μm, and more specifically, the same preferably has a thickness of about 1 μm. The compound semiconductor layer 13 is made of a compound semiconductor of a chalcopyrite structure.

The compound semiconductor of a chalcopyrite structure has the same crystal structure as chalcopyrite, and is expressed in a composition formula I-III-$VI_2$ or II-IV-$V_2$, for example. The Roman numerals in the composition formula represent group numbers in the periodic table. For example, the Roman numerals I and II represent elements of the groups IB and IIB respectively. In the composition formula, the group IB element includes Cu, Ag or the like, for example, the group IIIB element includes Al, Ga, In or the like, for example, and the group VIB element includes S, Se, Te or the like, for example. The group IIB element includes Zn, Cd or the like, for example, the group IVB element includes Si, Ge, Sn or the like, for example, and the group VB element includes P, As, Sb or the like, for example. In particular, the compound semiconductor of a chalcopyrite structure preferably has a I-III-VI$_2$ type chalcopyrite structure, and is more preferably a CIGS-based semiconductor expressed as Cu$_Y$(In$_X$Ga$_{1-X}$)Se$_2$ ($0 \leq Y \leq 1$ and $0 \leq X \leq 1$). The CIGS-based semiconductor can excellently absorb light from the near ultraviolet band (in the wave range of about 300 nm to 380 nm) to the near infrared band (in the wave range of about 780 nm to 1300 nm) through the visible band (in the wave range of 380 nm to 780 nm).

The buffer layer 14 is formed to cover generally the whole area of the upper surface of the compound semiconductor layer 13. A peripheral edge portion 131 of the compound semiconductor layer 13 is not covered with the buffer layer 14, but drawn out from the buffer layer 14 in a lateral direction along the front surface of the substrate 2. An insulating film 22 is formed to cover the peripheral edge portion 131 (the upper surface and side surfaces) of the compound semiconductor layer 13 and the upper surface of the interlayer film 19 on the periphery thereof. The buffer layer 14 has a thickness of 10 nm to 1000 nm, for example. The buffer layer 14 is preferably made of CdS, ZnS, (Cd$_X$Zn$_{1-X}$)S ($0 \leq X \leq 1$), ZnO, Zn(O, OH)S (Zn$_Z$Mg$_{1-Z}$)O ($0 \leq Z \leq 1$), ZnSe or In$_2$S$_3$, for example.

The transparent electrode layer 4 is formed to cover the whole area of the upper surface of the buffer layer 14. The transparent electrode layer 4 has a thickness of 10 nm to 1000 nm, for example. The transparent electrode layer 4 is preferably made of zinc oxide (ZnO), and may be formed by stacking a non-doped ZnO film (i-ZnO) and an n-type ZnO film (n-ZnO) successively from the side closer to the compound semiconductor layer 13, for example. Alternatively, the transparent electrode layer 4 may be made of indium tin oxide (ITO).

The metal electrode layer 6 is formed on the layered structure of the compound semiconductor layer 13, the buffer layer 14 and the transparent electrode layer 4, and a top portion thereof covers the peripheral edge portion 41 (the upper surface and side surfaces) of the transparent electrode layer 4. The insulating film 22 insulates the metal electrode layer 6 from the compound semiconductor layer 13 and the buffer layer 14. A lower portion of the metal electrode layer 6 is arranged on the interlayer film 19 in the lateral direction along the front surface of the substrate 2, and connected to the pads 7 through the pad connection portions 11.

The shielding layer 5 is formed on the transparent electrode layer 4. According to the first embodiment, the shielding layer 5 and the metal electrode layer 6 are made of the same material (aluminum, for example), and formed on the transparent electrode layer 4 together. Therefore, the shielding layer 5 and the metal electrode layer 6 can be formed through the same step, whereby manufacturing steps can be simplified. The plane shape of the shielding layer 5 is not particularly restricted. For example, the shielding layer 5 may be formed over the whole peripheries of boundaries 31 between the pixels 3 adjacent to one another, or may be selectively formed on part of the boundaries 31 in plan view.

The shielding layer 5 formed over the whole peripheries of the boundaries 31 may have a constant width W$_1$ in a direction across the boundaries 31, for example (see FIG. 3A). The width W$_1$ is preferably not more than 30% of the width W$_2$ (the pixel size) of each pixel 3, and is more preferably 1% to 30% of the width W$_2$. More specifically, the width W$_1$ is preferably not more than 2.5 μm (more preferably, 0.05 μm to 2.5 μm) when the size of each pixel 3 is 7.5 μm by 7.5 μm. Further, the width W$_1$ of the shielding layer 5 may not be constant. For example, the shielding layer 5 may have a relatively large width on corner portions of the boundaries 31 of the pixels 3 provided in the form of quadrangles in plan view, and may have a relatively small width on side portions of the boundaries 31. In this case, the shielding layer 5 may partition circular regions in an inner region thereof (see FIG. 3B).

On the other hand, the shielding layer 5 selectively formed on part of the boundaries 31 may be formed only on the corner portions of the boundaries 31, to selectively expose the side portions of the boundaries 31, for example (see FIG. 3C). The corner portions of the boundaries 31 are present on positions separating from the lower electrode layers 10 arranged at the centers of the pixels 3, as compared with the side portions of the boundaries 31. Thus, light incident in the vicinity of the corner portions of the boundaries 31 more easily causes crosstalk as compared with that incident in the vicinity of the side portions of the boundaries 31. Therefore, an effect of preventing crosstalk can be sufficiently attained by simply selectively forming the shielding layer 5 only on the corner portions, as shown in FIG. 3C.

The sectional shape of the shielding layer 5 is not particularly restricted either, similarly to the plane shape. For example, the shielding layer 5 may be rectangular in sectional view, similarly to a shielding layer 5A shown in FIG. 4. Alternatively, the shielding layer 5 may be trapezoidal in sectional view. In this case, the shielding layer 5 may be tapered upward similarly to a shielding layer 5B shown in FIG. 4, or may be tapered downward similarly to a shielding layer 5C shown in FIG. 4. The shape of the shielding layer 5B shown in FIG. 4 can be obtained by adjusting etching conditions for molding the shielding layer 5B by patterning the material (aluminum, for example) for the shielding layer 5, for example.

According to the first embodiment, the thickness of the shielding layer 5 is identical to that of the metal electrode layer 6. More specifically, the thickness of the shielding layer 5 is 10 nm to 1000 nm. The thickness of the shielding layer 5 can be properly varied with the specification of the photoelectric converter 1. Further, the shielding layer 5 can be separated from the metal electrode layer 6 and formed with a different thickness.

The surface protective film 15 is made of an insulating material such as silicon nitride (Si$_3$N$_4$), for example. The surface protective film 15 is formed to cover the shielding layer 5, the metal electrode layer 6, the pad connection portions 11 and the pads 7. The surface protective film 15 completely covers the shielding layer 5 and the metal electrode layer 6, not to expose the same. The pads 7 are partially selectively exposed from openings formed in the surface protective film 15.

Figure 5:
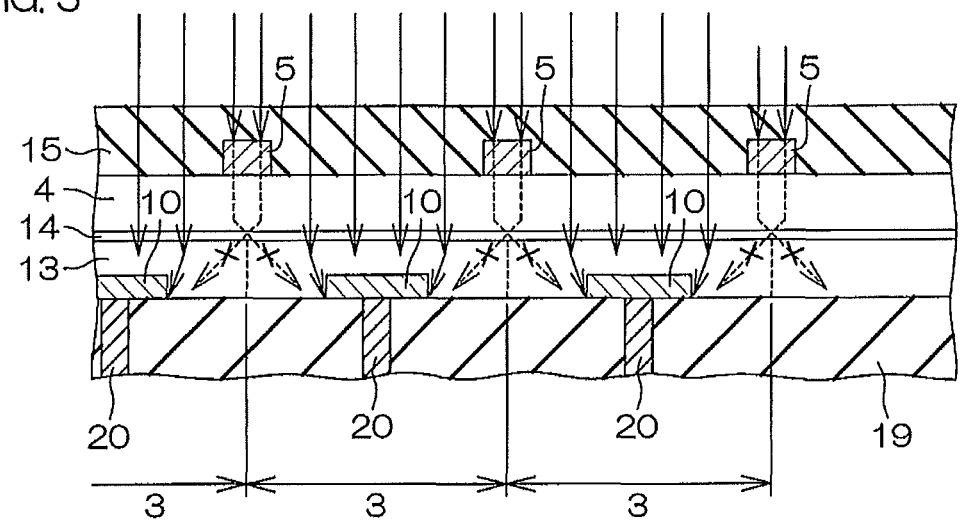
FIG. 5 is a diagram illustrating an effect of the photoelectric converter preventing the occurrence of crosstalk.

FIG. 5 is a diagram illustrating the effect of the photoelectric converter 1 preventing crosstalk. As shown in FIG. 5, the shielding layer 5 is arranged to extend over the boundaries 31 between the plurality of pixels 3 in the photoelectric converter 1. Thus, the shielding layer 5 can block light incident in the vicinity of the boundaries 31. Therefore, the photoelectric converter 1 can prevent occurrence of such crosstalk that light incident upon each pixel 3 proceeds to the pixel 3 adjacent thereto beyond the boundary 31 therebetween. When employed as an image sensor, for example, the photoelectric converter 1 can prevent image blurring or the like resulting from crosstalk. Consequently, sensitivity dispersion between the pixels 3 of the photoelectric converter 1 can be reduced (the pixels 3 can be uniformized in sensitivity), and a photoelectric converter having a high SN ratio (signal-to-noise ratio) can be provided.

According to the first embodiment, the compound semiconductor layer 13 is formed to collectively cover the plurality of lower electrode layers 10, and no grooves or the like are formed for physically isolating the adjacent pixels 3 from one another. In the manufacturing steps, therefore, the compound semiconductor layer 13 may not be etched to be partitioned correspondingly to the lower electrode layers 10 after the same is deposited to cover the lower electrode layers 10. Consequently, generation of dark current resulting from etching damage or residues can also be prevented in the compound semiconductor 13.

Effects of the photoelectric converter 1 according to the first embodiment are now described with reference to experimental data shown in FIGS. 6 to 8.

Figure 6:
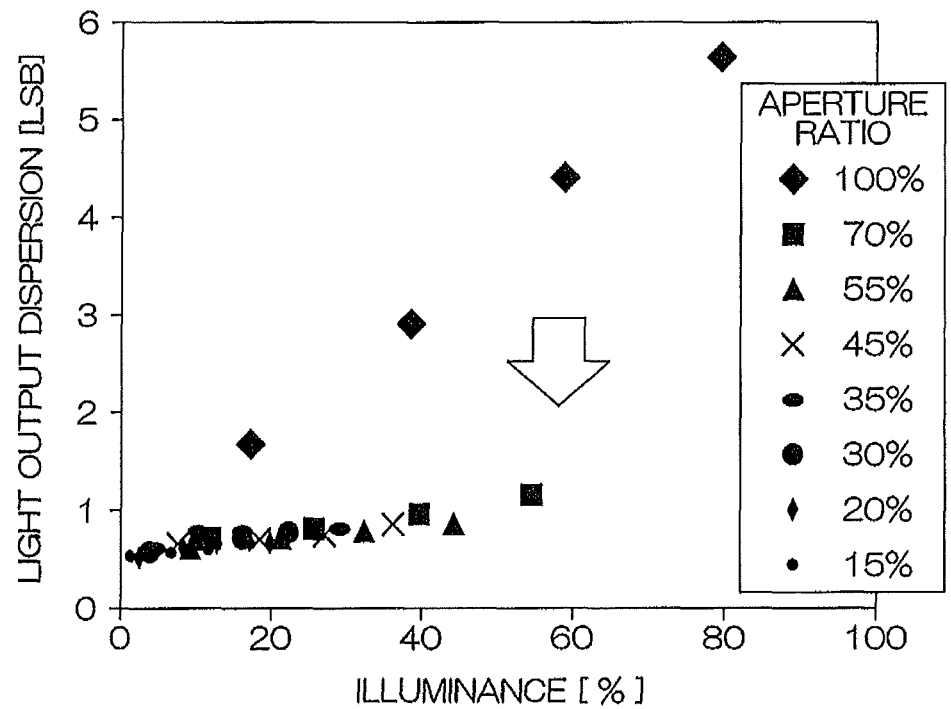
FIG. 6 is a correlation diagram between light output dispersion and illuminance of photoelectric converters.

FIG. 6 is a correlation diagram between light output dispersion (standard deviation) and illuminance of photoelectric converters. In other words, FIG. 6 illustrates how the light output dispersion resulting from crosstalk is related to change in the illuminance of a light source. According to FIG. 6, the light output dispersion increases following increase in the illuminance in a photoelectric converter provided with no shielding layer 5 and having an aperture ratio of 100%. This is because the quantity of light (light flux) incident in the vicinity of boundaries 31 between pixels 3 increases following the increase in the illuminance to easily cause crosstalk as a result.

When shielding layers 5 are provided, on the other hand, the light output dispersion is generally constant regardless of illuminance levels. This is because the shielding layer 5 blocks most of light incident in the vicinity of boundaries 31 to hardly cause crosstalk whether the quantity of light flux is small and the illuminance is low or the quantity of light flux is large and the illuminance is high. Even if aperture ratios vary with the widths $W_1$ of the shielding layers 5, generally equivalent effects of suppressing light output dispersion can be attained, as shown in FIG. 6. In other words, the light output dispersion can be reduced regardless of the aperture ratio (i.e., the width $W_1$ of the shielding layer 5), by providing the shielding layer 5.

Figure 7:
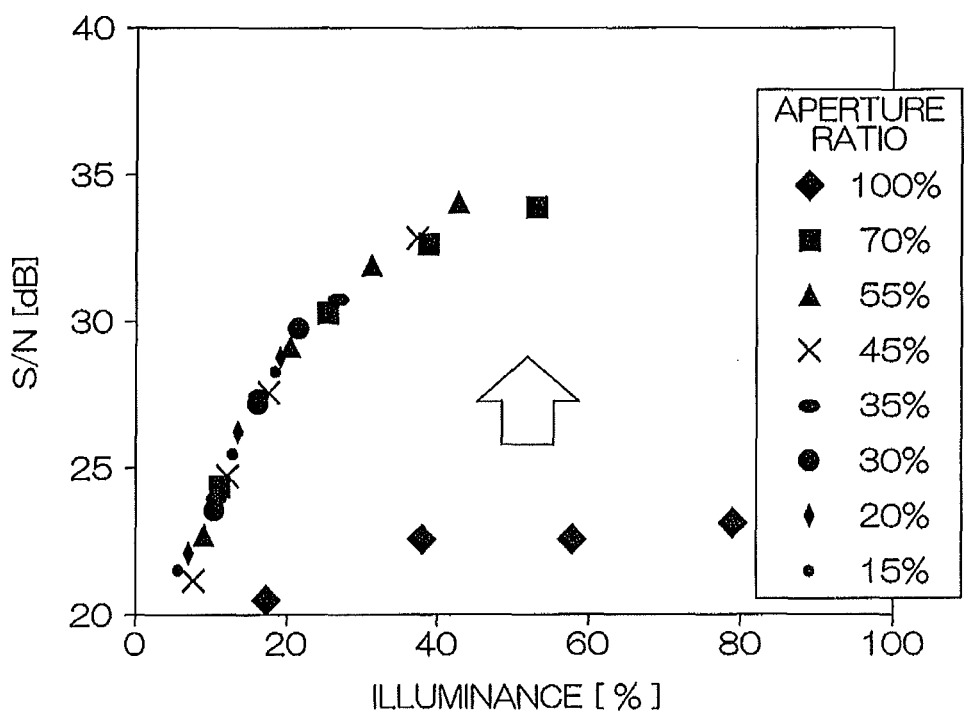
FIG. 7 is a correlation diagram between SN ratios and illuminance levels of the photoelectric converters.

Thus, crosstalk is reduced to reduce light output dispersion due to the setting of the shielding layer 5, whereby the SN ratio (S/N) of the photoelectric converter 1 can be increased, as shown in FIG. 7. FIG. 7 is a correlation diagram between SN ratios and illuminance levels of the photoelectric converters. According to FIG. 7, crosstalk (noise) also increases following increase in illuminance (see FIG. 6) in the photoelectric converter having the aperture ratio of 100%, and hence the SN ratio thereof hardly increases even if the illuminance increases to increase the signal.

When the shielding layers 5 are provided (the aperture ratios are less than 100%), on the other hand, crosstalk (noise) hardly occurs regardless of change in the illuminance (see FIG. 6), whereby the SN ratios improve in response to increase in the signals following increase in the illuminance. Further, the SN ratios increase in generally identical proportions even if the aperture ratios vary with the widths $W_1$ of the shielding layers 5, as shown in FIG. 7. In other words, the SN ratio can be increased by increasing the illuminance of the light source, regardless of the aperture ratio (i.e., the width $W_1$ of the shielding layer 5).

Figure 8:
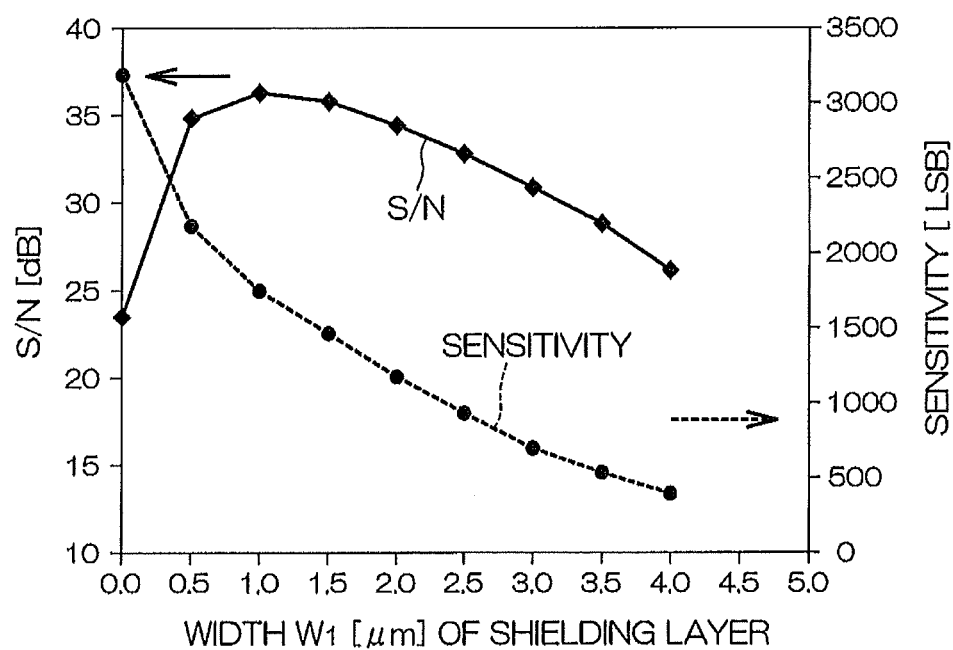
FIG. 8 is a graph showing the relation between widths of shielding layers and SN ratios.

FIG. 8 is a graph showing the relation between the widths $W_1$ of the shielding layers 5 and the SN ratios. How the SN ratios change following change in the widths $W_1$ of the shielding layers 5 under the same illuminance conditions is described with reference to FIG. 8.

According to FIG. 8, the SN ratio is about 23 dB, i.e., at the lowest level among the data shown in FIG. 8, when the width $W_1$ of the shielding layer 5 is 0.0 μm (i.e., in the photoelectric converter provided with no shielding layer 5).

When the widths $W_1$ of the shielding layers 5 are greater than 0.0 μm, on the other hand, the SN ratios of all such photoelectric converters are higher than that of the photoelectric converter exhibiting the width $W_1$ of 0.0 μm, while the same are reduced following increase in the widths $W_1$ from a peak SN ratio of about 36 dB in the photoelectric converter exhibiting the width $W_1$ of 1.0 μm. This is because the quantity of light flux incident upon each pixel 3 is reduced to reduce the absolute quantity of the signal and to lower sensitivity due to reduction of the aperture ratio of a compound semiconductor 13 following the increase in the width $W_1$. Therefore, the width $W_1$ of the shielding layer 5 is preferably set to a proper value. According to FIG. 8, the width $W_1$ of the shielding layer 5 is preferably set to not more than 2.5 μm (when the size of the pixels 3 is 7.5 μm by 7.5 μm), and more preferably set to 0.05 μm to 2.5 μm. When the width $W_1$ is in such a range, the aperture ratio of the compound semiconductor layer 13 can be relatively increased and a sufficient signal can be obtained in each pixel 3, whereby the SN ratio of the photoelectric converter 1 can be set in the range of 28 dB to 36 dB.

Figure 9:
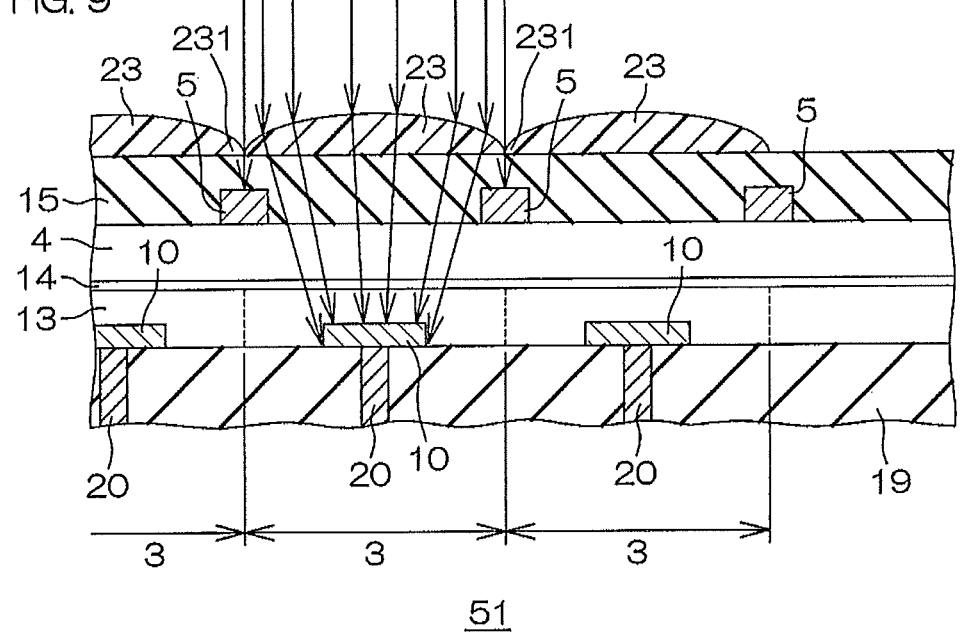
FIG. 9 is a schematic sectional view of a photoelectric converter according to a second embodiment of the present invention.

FIG. 9 is a schematic plan view of a photoelectric converter according to a second embodiment of the present invention. Referring to FIG. 9, portions corresponding to those shown in FIGS. 2 and 5 are denoted by the same reference numerals.

A photoelectric converter 51 according to the second embodiment further includes microlenses 23 arranged on a transparent electrode layer 4 (the outermost surface of the photoelectric converter 51 (the front surface of a surface protective film 15) according to the second embodiment). The microlenses 23 are convex lenses made of resin, an oxide, a nitride, a fluoride or the like, for example, and provided one by one for respective pixels 3. The microlenses 23 are formed to be larger in size than inner regions of a shielding layer 5 surrounding the pixels 3 located under the same. Thus, peripheral edge portions 231 of the microlenses 23 overlap the shielding layer 5 in a lateral direction along the front surface of a substrate 2. No clearances may be provided between the microlenses 23 adjacent to one another as shown in FIG. 9, or clearances may be provided therebetween.

According to the photoelectric converter 51, the microlenses 23 can converge light incident upon the pixels 3 on lower electrode layers 10. According to the second embodiment, further, the peripheral edge portions 231 of the microlenses 23 overlap the shielding layer 5, whereby the quantity of light flux incident in the vicinity of the shielding layer 5 can be reduced, and the occurrence of crosstalk can be further suppressed. Consequently, the signal detected by the lower electrode layers 10 can be increased, whereby the SN ratio of the photoelectric converter 51 can be further increased. The photoelectric converter 51 can also attain effects similar to those of the photoelectric converter 1, as a matter of course.

Figure 10:
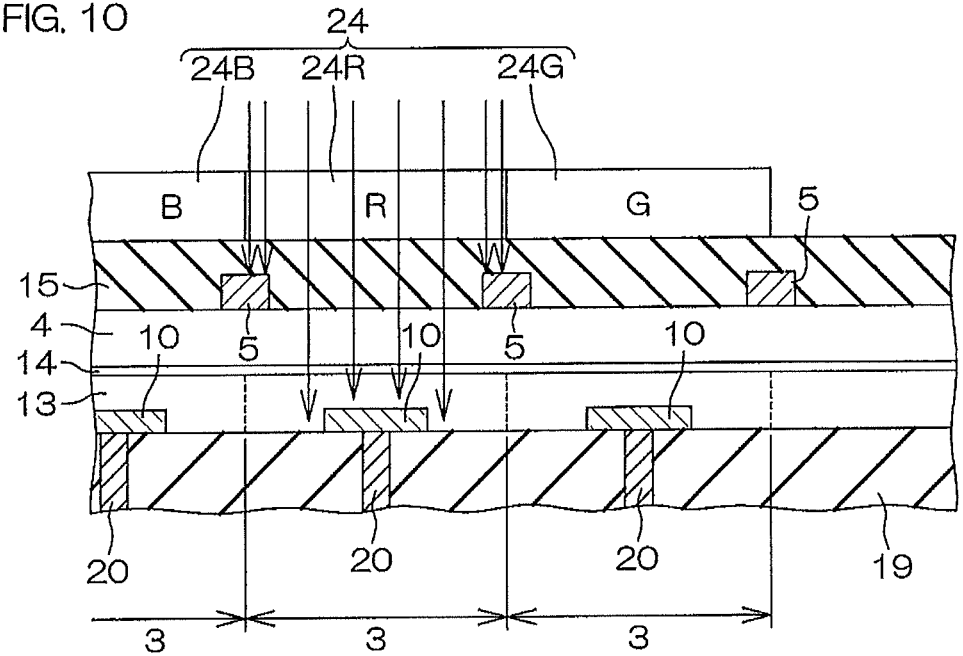
FIG. 10 is a schematic sectional view of a photoelectric converter according to a third embodiment of the present invention.

FIG. 10 is a schematic plan view of a photoelectric converter according to a third embodiment of the present invention. Referring to FIG. 10, portions corresponding to those shown in FIGS. 2 and 5 are denoted by the same reference numerals.

A photoelectric converter 61 according to the third embodiment further includes a color filter 24 arranged on a transparent electrode layer 4 (the outermost surface of the photoelectric converter 61 (the front surface of a surface protective film 15) according to the third embodiment). The color filter 24 includes visible light filters, i.e., R (red), G (green) and B (blue) filters 24R, 24G and 24B, which are regularly arrayed. IR (infrared ray) filters may be arranged to be adjacent to the visible light filters. Whether or not the IR filters transmit visible light can be arbitrarily selected. Tetragonal lattice arrangement, honeycomb arrangement or the like can be applied to the color filter 24, for example.

Figure 11A:
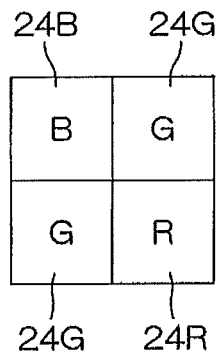
FIGS. 11A and 11B illustrate examples of arrangement of a color filter in the photoelectric converter.
Figure 11B:
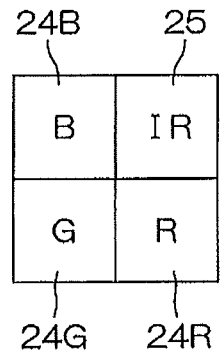

When the tetragonal lattice arrangement is applied to the color filter 24, a pair of R and B filters 24R and 24B may be arranged to be opposed to each other so that two G filters 24G are diagonally arranged along the other diagonal line, as shown in FIG. 11A, for example. In this case, one of the G filters 24G may be replaced with an IR filter 25, as shown in FIG. 11B.

A color resist film based on a pigment, a transmission resist film formed by a nanoimprint technique, a gelatin film or the like can be applied to the color filter 24, for example.

According to the photoelectric converter 61, the color filter 24 and the shielding layer 5 are combined with each other, whereby color mixing resulting from crosstalk can be excellently prevented. The photoelectric converter 61 can also attain effects similar to those of the photoelectric converter 1, as a matter of course.

Figure 12:
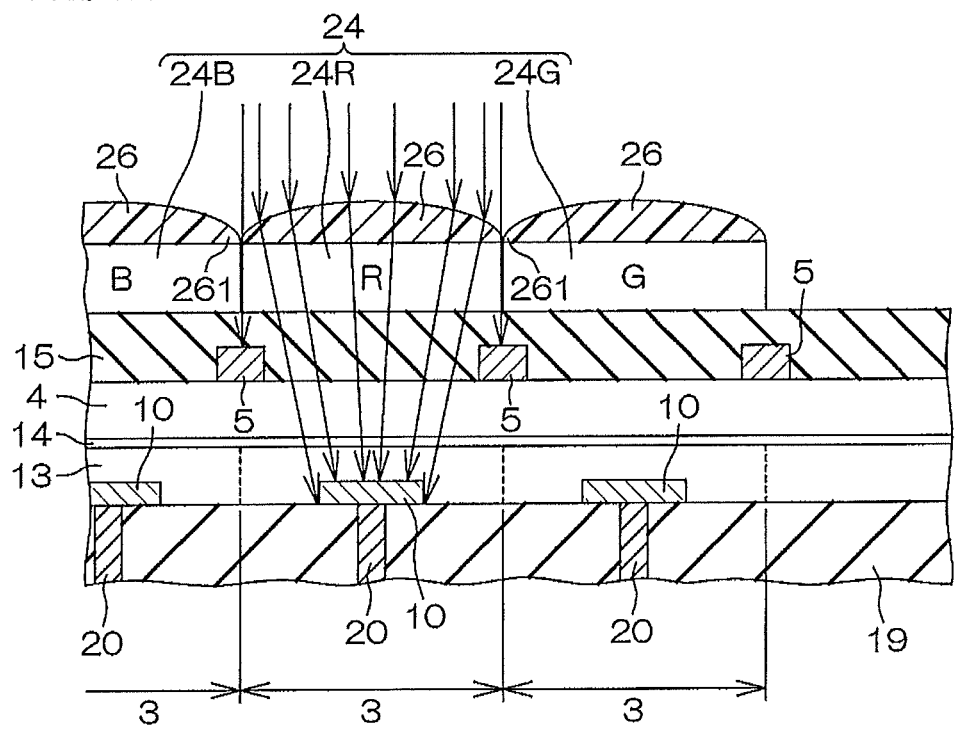
FIG. 12 is a schematic sectional view of a photoelectric converter according to a fourth embodiment of the present invention.

FIG. 12 is a schematic sectional view of a photoelectric converter according to a fourth embodiment of the present invention. Referring to FIG. 12, portions corresponding to those shown in FIGS. 2, 5 and 10 are denoted by the same reference numerals.

A photoelectric converter 71 according to the fourth embodiment further includes microlenses 26 arranged on a transparent electrode layer 4 (the outermost surface of the photoelectric converter 71 (the front surface of a color filter 24) according to the fourth embodiment). The microlenses 26 are arranged similarly to the microlenses 23 of the photoelectric converter 51 according to the aforementioned second embodiment. For example, peripheral edge portions 261 of the microlenses 26 overlap a shielding layer 5 in a lateral direction along the front surface of a substrate 2.

According to the photoelectric converter 71, the microlenses 26 can converge light incident upon pixels 3 on lower electrode layers 10. Consequently, the signal detected by the lower electrode layers 10 can be increased, whereby the SN ratio of the photoelectric converter 71 can be further increased. The photoelectric converter 71 can also attain effects similar to those of the photoelectric converter 1, as a matter of course.

Figure 13:
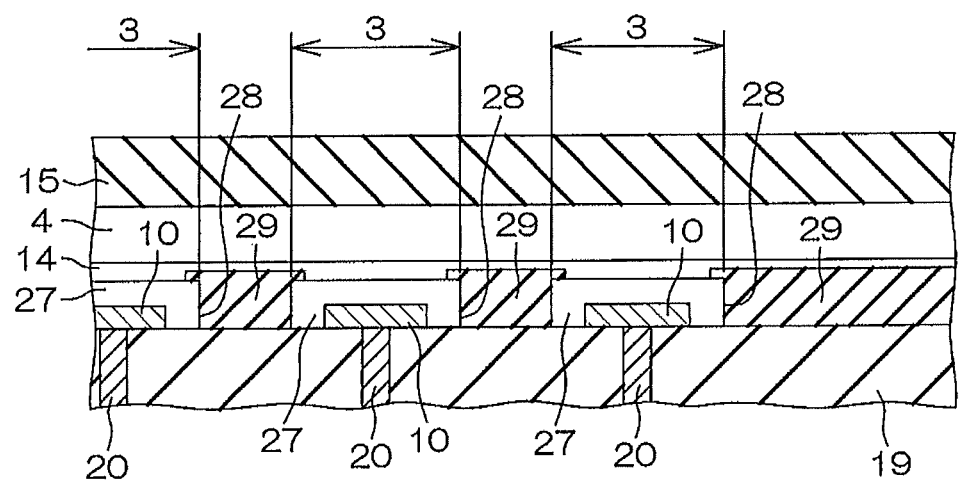
FIG. 13 is a schematic sectional view of a photoelectric converter according to a fifth embodiment of the present invention.

FIG. 13 is a schematic sectional view of a photoelectric converter according to a fifth embodiment of the present invention. Referring to FIG. 13, portions corresponding to those shown in FIGS. 2 and 5 are denoted by the same reference numerals.

According to each of the aforementioned first to fourth embodiments, the compound semiconductor layer 13 is formed to collectively cover the plurality of lower electrode layers 10. On the other hand, a photoelectric converter 81 according to the fifth embodiment includes a plurality of compound semiconductor layers 27 arranged one by one on lower electrode layers 10 respectively. Clearances 28 are provided between the compound semiconductor layers 27 adjacent to one another. An insulating layer 29 is arranged on an interlayer film 19, to fill up the clearances 28. The insulating layer 29 is made of an insulating material such as silicon dioxide ($SiO_2$).

According to the photoelectric converter 81, the clearances 28 are provided between the compound semiconductor layers 27 adjacent to one another, whereby the occurrence of crosstalk can be more excellently prevented.

Figure 14A:
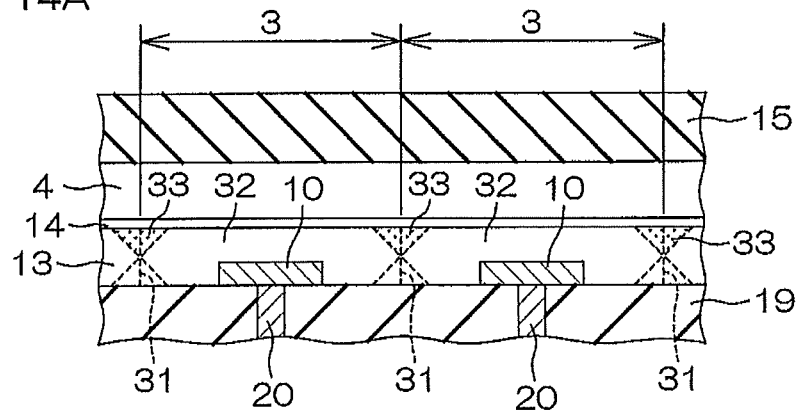
FIGS. 14A and 14B are diagrams for illustrating influences exerted by the thicknesses of lower electrode layers on spreading of depletion layers.
Figure 14B:
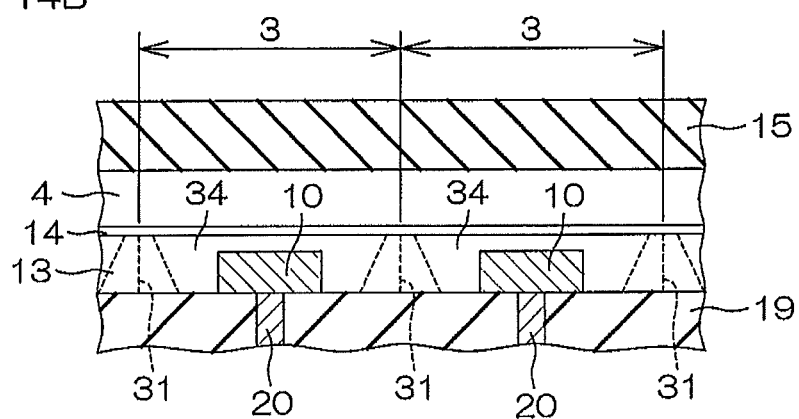

FIGS. 14A and 14B are diagrams for illustrating influences exerted by the thicknesses of the lower electrode layers 10 on spreading of depletion layers.

In each of the aforementioned photoelectric converters 1, 51, 61 and 71, the thickness of the lower electrode layers 10 is 50 nm to 200 nm. Therefore, depletion layers 32 generated from the interfaces between the lower electrode layers 10 and the compound semiconductor layer 13 can be spread to the adjacent pixels 3, as shown in FIG. 14A. Thus, overlapping portions 33 are formed by a plurality of depletion layers 32 overlapping one another in the vicinity of the boundaries 31 between the pixels 3.

When the thickness of the lower electrode layers 10 exceeds 200 nm, on the other hand, depletion layers 34 generated from the interfaces between the lower electrode layers 10 and the compound semiconductor layer 13 remain in the pixels 3 of the lower electrode layers 10, as shown in FIG. 14B. Therefore, portions in the vicinity of the boundaries 31 between the pixels 3 are occupied by regions (undepleted regions) provided with absolutely no depletion layers. Consequently, such crosstalk occurs that electric signals input in the lower electrode layers 10 progress toward the lower electrode layers 10 adjacent thereto through the undepleted regions.

In other words, each of the aforementioned photoelectric converters 1, 51, 61 and 71 can spread the depletion layers 32 toward the adjacent pixels 3, whereby the occurrence of crosstalk can be excellently suppressed without separating the compound semiconductor layer 13 along the boundaries 31.

Further, the compound semiconductor layer 13 collectively covers the lower electrode layers 10, and is not separated every pixel 3. Therefore, no working for pixel separation may be performed when manufacturing the photoelectric converter 1, 51, 61 or 71, whereby manufacturing steps can be simplified. In addition, the compound semiconductor layer 13 can be prevented from damage resulting from such working.

The relation between the thickness of the lower electrode layers 10 and dark current has been investigated. Two types of photoelectric converters similar to the photoelectric converter 1 shown in FIG. 2 were prepared with lower electrode layers 10 having thicknesses of 300 nm and 100 nm respectively.

Then, SEM images of the photoelectric converters were obtained, to observe void defects formed in spaces between compound semiconductor layers 13 and transparent electrode layers 4. As a result, void defects were formed in the photoelectric converter including the lower electrode layers 10 having the thickness of 300 nm, while no void defects were observed in the photoelectric converter including the lower electrode layers 10 having the thickness of 100 nm. In other words, it has been recognized that a step between the compound semiconductor layer 13 and the transparent electrode layer 4 can be reduced when the thickness of the lower electrode layers 10 can be set to 50 nm to 200 nm, so that formation of void defects can be suppressed in the space between the compound semiconductor layer 13 and the transparent electrode layer 4.

Figure 15:
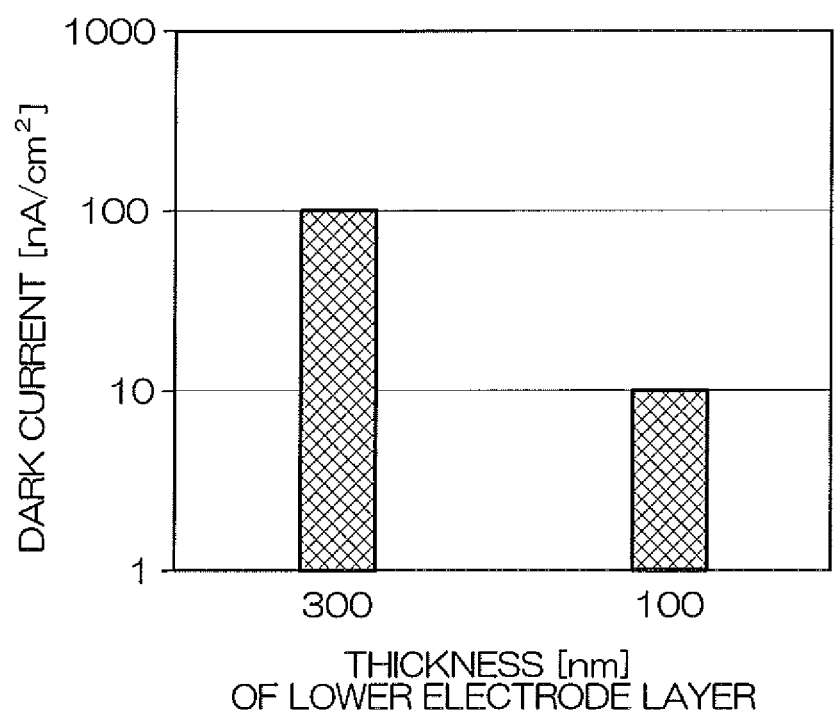
FIG. 15 is a graph showing the relation between the thicknesses of the lower electrode layers and dark current.

Then, the levels of dark current generated in the photoelectric converters were investigated. FIG. 15 shows the results. FIG. 15 is a graph showing the relation between the thicknesses of the lower electrode layers 10 and the dark current.

According to FIG. 15, the levels of the dark current were 100 nA/cm$^2$ and 10 nA/cm$^2$ in the photoelectric converters including the lower electrode layers 10 having the thicknesses of 300 nm and 100 nm respectively.

In other words, it has been recognized through FIG. 15 that the photoelectric converter (including the lower electrode layers 10 having the thickness of 100 nm) exhibiting no void defects can more suppress dark current as compared with the photoelectric converter (including the lower electrode layers 10 having the thickness of 300 nm) exhibiting void defects.

Figure 16:
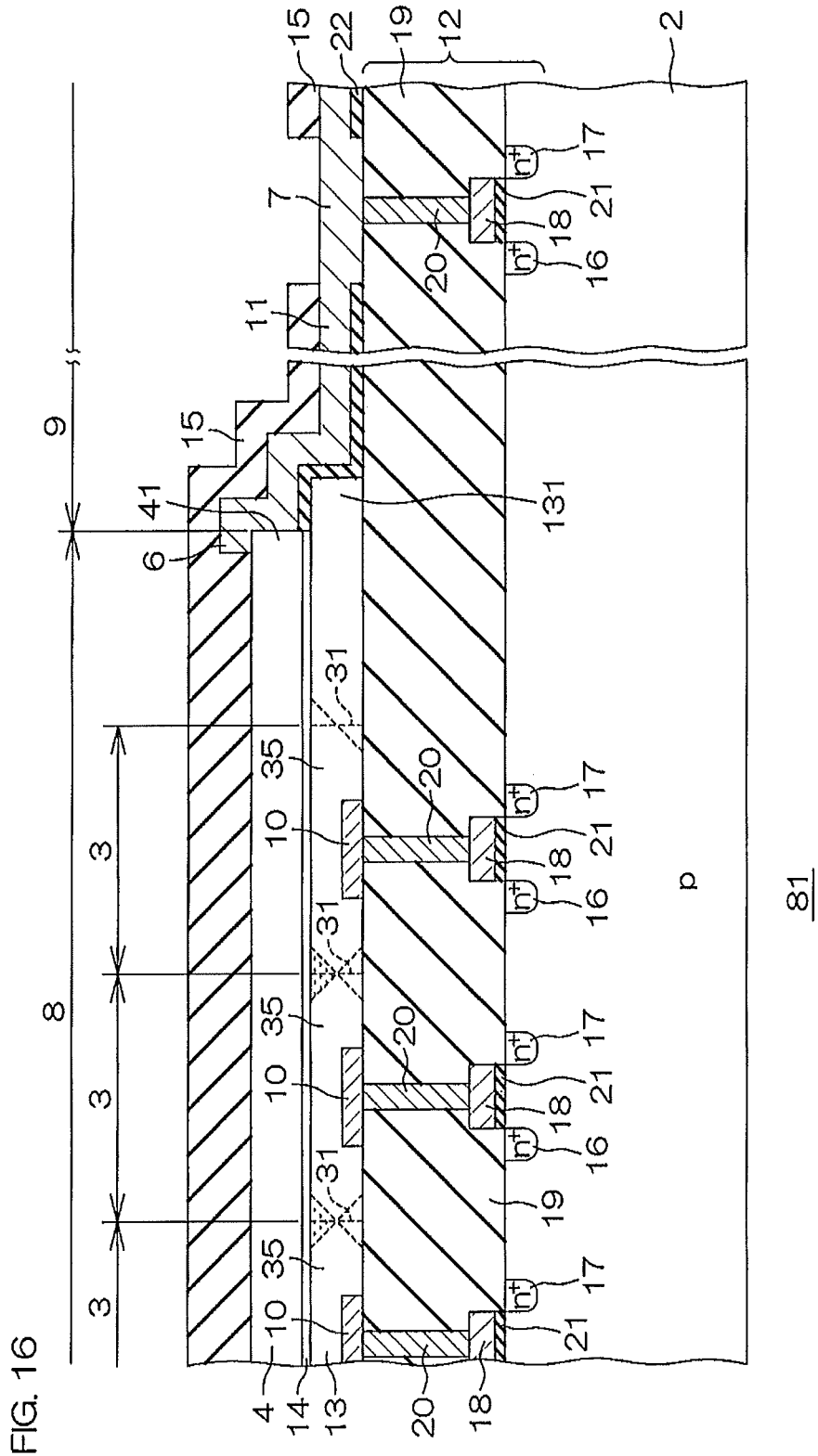
FIG. 16 is a schematic sectional view of a photoelectric converter according to a sixth embodiment of the present invention.

FIG. 16 is a schematic sectional view of a photoelectric converter according to a sixth embodiment of the present invention. Referring to FIG. 16, portions corresponding to those shown in FIG. 2 are denoted by the same reference numerals.

A photoelectric converter 81 according to the sixth embodiment has a structure obtained by removing the shielding layer 5 from the photoelectric converter 1 according to the first embodiment.

The photoelectric converter 81 can also spread depletion layers 35 to adjacent pixels 3 similarly to each of the aforementioned photoelectric converters 1, 51, 61 and 71, whereby the occurrence of crosstalk can be excellently suppressed without separating a compound semiconductor layer 13 along boundaries 31 between the pixels 3.

Therefore, crosstalk can be suppressed also when the shielding layer 5 is removed, whereby the photoelectric converter 81 can be relatively easily manufactured.

Figure 17:
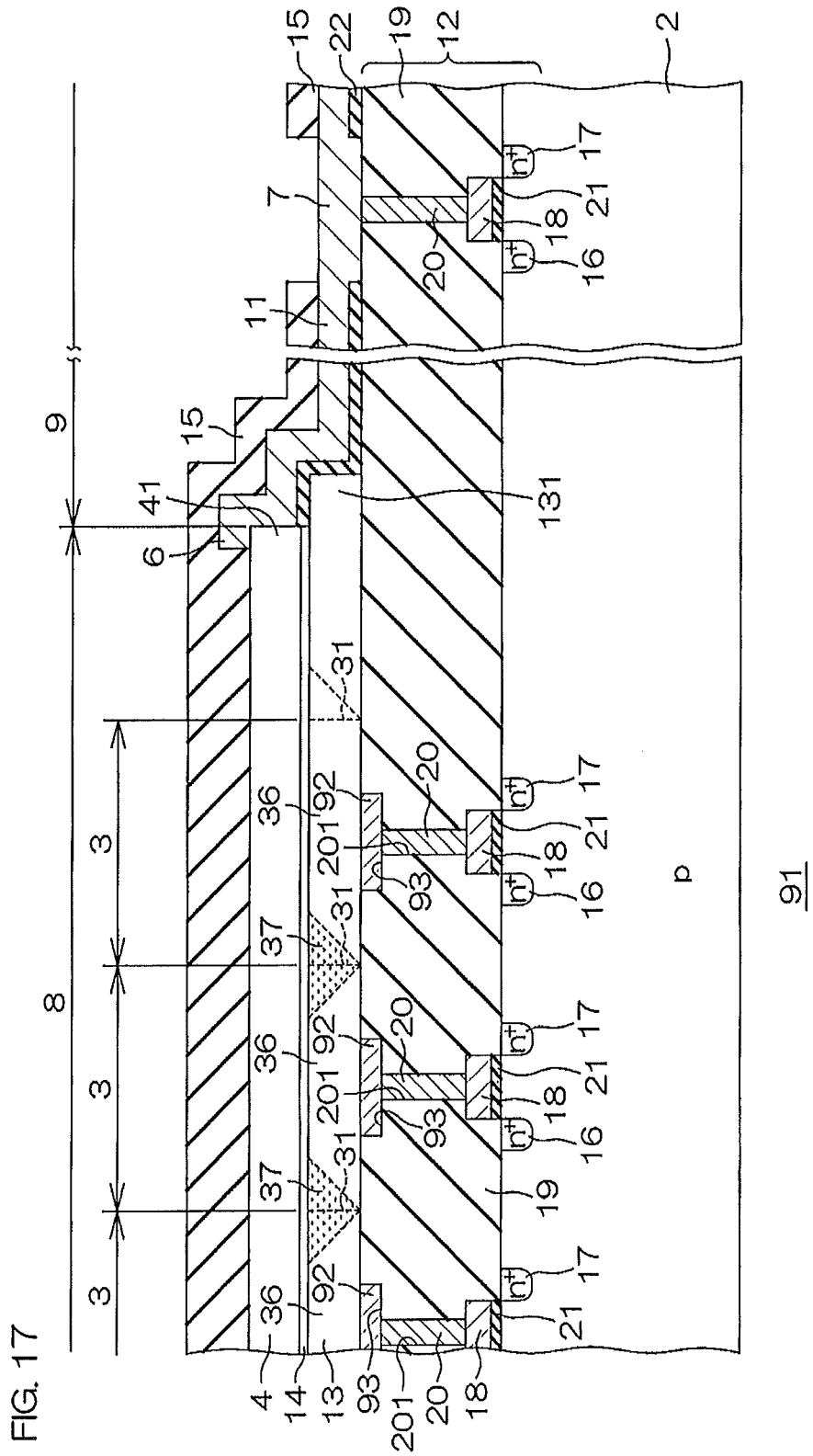
FIG. 17 is a schematic sectional view of a photoelectric converter according to a seventh embodiment of the present invention.

FIG. 17 is a schematic sectional view of a photoelectric converter according to a seventh embodiment of the present invention. Referring to FIG. 17, portions corresponding to those shown in FIG. 2 are denoted by the same reference numerals.

A photoelectric converter 91 according to the seventh embodiment has a structure obtained by removing the shielding layer 5 from the photoelectric converter 1 according to the first embodiment, and has lower electrode layers 92 embedded in an interlayer film 19, in place of the lower electrode layers 10.

The lower electrode layers 92 are completely embedded in the interlayer film 19, so that the upper surfaces thereof are flush with the front surface of the interlayer film 19. In this case, the thickness of the lower electrode layers 92 (the depth of dug portions 93) is preferably 50 nm to 200 nm.

In order to form such lower electrode layers 92, via holes 201 and the dug portions 93 corresponding to the patterns of the lower electrode layers 92 are first formed by etching the interlayer film 19, for example. Then, a tungsten material is deposited on the interlayer film 19 by CVD, to fill up the via holes 201 and the dug portions 93. Then, the front surface of the tungsten material is polished by CMP, until the polished surfaces are flush with the front surface of the interlayer film 19. Thus, the lower electrode layers 92 integral with via electrodes 20 can be formed, and easily patterned.

According to the structure, the lower electrode layers 92 are completely embedded in the interlayer film 19. Therefore, depletion layers 36 generated from the interfaces between the lower electrode layers 92 and the compound semiconductor layer 13 can be spread to adjacent pixels 3, as shown in FIG. 17. Thus, overlapping portions 37 are formed by a plurality of depletion layers 36 overlapping one another in the vicinity of the boundaries 31 between the pixels 3. Further, the overlapping portions 37 spread from the front surface of the compound semiconductor layer 13 up to the front surface of the interlayer film 19 in the vicinity of the boundaries 31. Therefore, the compound semiconductor layer 13 can be completely depleted. Consequently, crosstalk can be reliably prevented.

Further, the space between the compound semiconductor layer 13 and a transparent electrode layer 4 can be planarized, whereby formation of void defects can be more excellently suppressed in the space.

Figure 18:
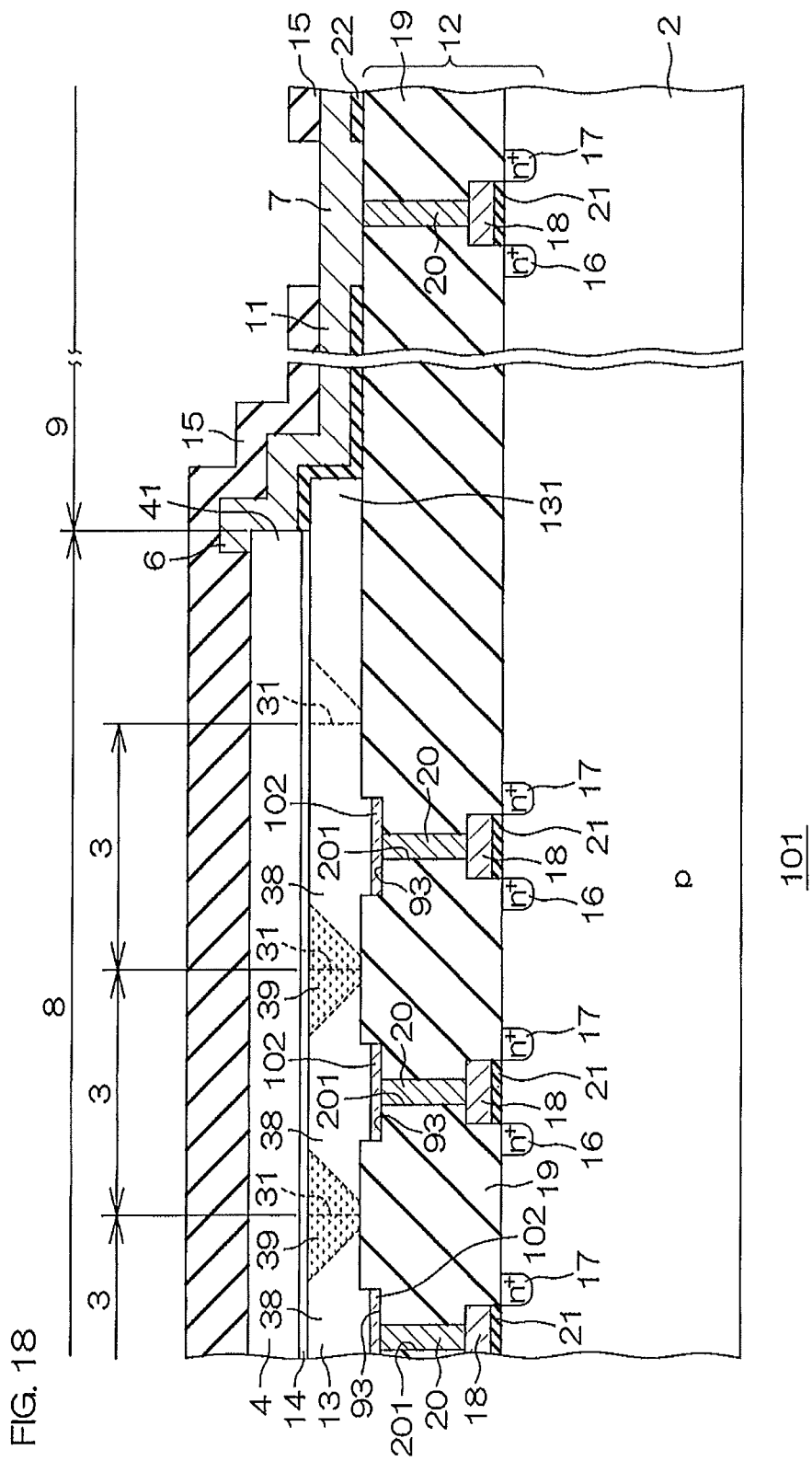
FIG. 18 is a schematic sectional view of a photoelectric converter according to an eighth embodiment of the present invention.

FIG. 18 is a schematic sectional view of a photoelectric converter according to an eighth embodiment of the present invention. Referring to FIG. 18, portions corresponding to those shown in FIGS. 2 and 17 are denoted by the same reference numerals.

A photoelectric converter 101 according to the eighth embodiment has lower electrode layers 102 embedded in an interlayer film 19 so that the upper surfaces thereof are lower than the front surface of the interlayer film 19, in place of the lower electrode layers 92 of the photoelectric converter 91 according to the seventh embodiment. In this case, the thickness of the lower electrode layers 102 is preferably 50 nm to 200 nm.

In order to form such lower electrode layers 102, a tungsten material is polished until the polished surface is flush with the front surface of the interlayer film 19 similarly to the manufacturing step described with reference to the seventh embodiment, and surface portions of the tungsten material in dug portions 93 are selectively removed by dry-etching the polished surface, for example. Thus, the lower electrode layers 102 having the upper surfaces on positions lower than the front surface of the interlayer film 19 can be formed.

According to the structure, the lower electrode layers 102 are completely embedded in the interlayer film 19. Therefore, depletion layers 38 generated from the interfaces between the lower electrode layers 102 and a compound semiconductor layer 13 can be spread up to adjacent pixels 3, as shown in FIG. 18. Thus, overlapping portions 39 are formed by a plurality of depletion layers 38 overlapping one another in the vicinity of boundaries 31 between the pixels 3. Further, the overlapping portions 39 spread from the front surface of the compound semiconductor layer 13 up to the front surface of the interlayer film 19 in the vicinity of the boundaries 31. Therefore, the compound semiconductor layer 13 can be completely depleted. Consequently, crosstalk can be reliably prevented.

Figure 19:
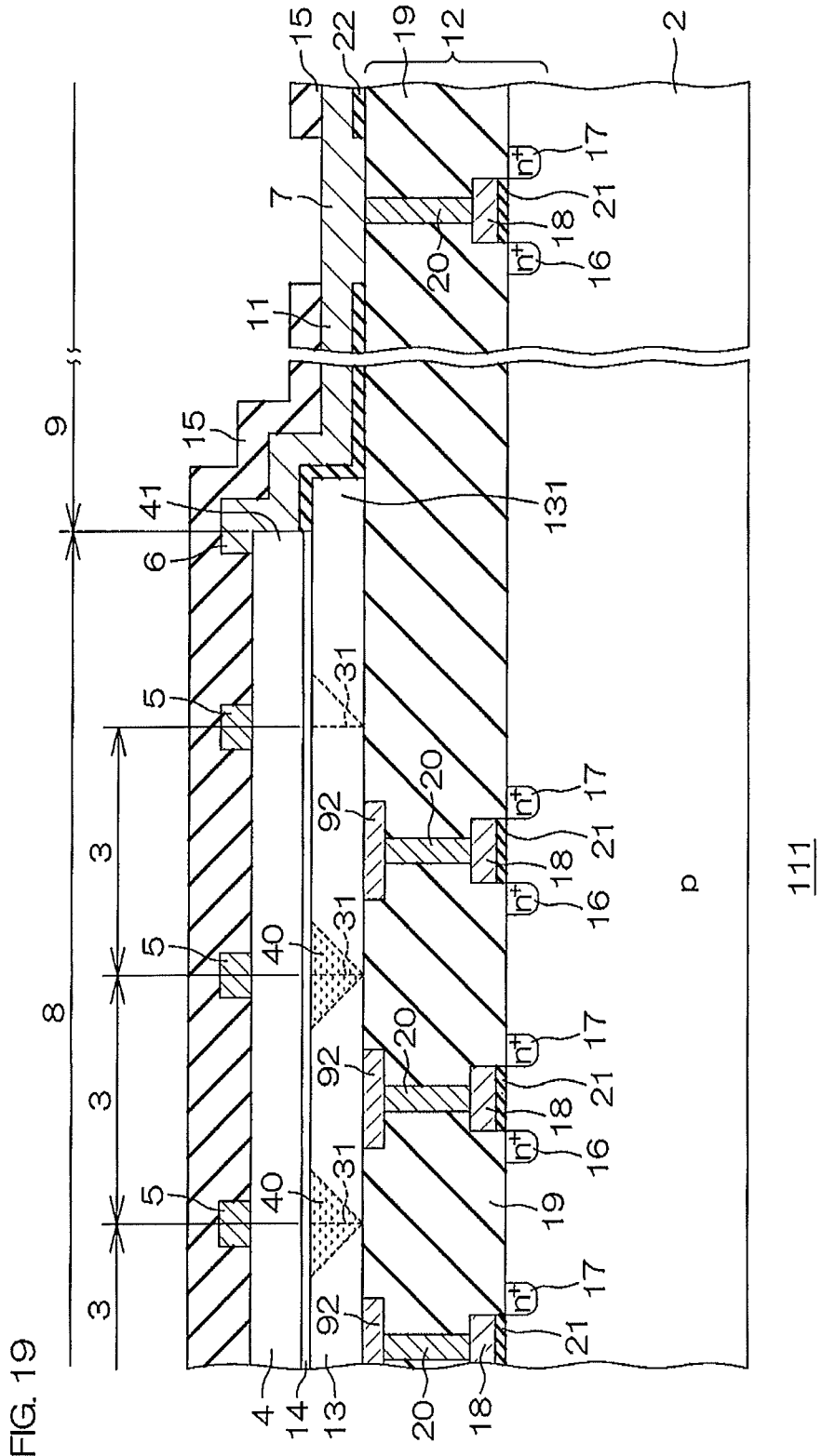
FIG. 19 is a schematic sectional view of a photoelectric converter according to a ninth embodiment of the present invention.

FIG. 19 is a schematic sectional view of a photoelectric converter according to a ninth embodiment of the present invention. Referring to FIG. 19, portions corresponding to those shown in FIGS. 2 and 17 are denoted by the same reference numerals.

A photoelectric converter 111 according to the ninth embodiment further includes a shielding layer 5 formed on a transparent electrode layer 4 in a structure similar to that of the photoelectric converter 91 according to the seventh embodiment.

The photoelectric converter 111 can also spread depletion layers 40 up to adjacent pixels 3 similarly to the aforementioned photoelectric converter 91 according to the seventh embodiment, whereby the occurrence of crosstalk can be excellently suppressed without separating a compound semiconductor layer 13 along boundaries 31 between the pixels 3.

Further, the occurrence of crosstalk can be further suppressed, due to the formation of the shielding layer 5.

While the embodiments of the present invention have been described, the present invention may be embodied in other ways.

For example, while the shielding layer 5 is made of aluminum in each of the first to fifth, eighth and ninth embodiments, the material for the shielding layer 5 is not particularly restricted, so far as the same can block light having a wavelength (300 nm to 1300 nm) absorbable by a compound semiconductor of a chalcopyrite structure. For example, the shielding layer 5 may be made of a shielding material such as black resist or black resin.

The shielding layer 5 may not be formed on the transparent electrode layer 4. Alternatively, the shielding layer 5 may be formed on the compound semiconductor layer 13, or on the buffer layer 14. Further, the shielding layer 5 may not be completely covered with the surface protective film 15, also when the same is formed on the transparent electrode layer 4. For example, a shielding layer 5D may be covered to pass through a surface protective film 13 (or may be an interlayer film formed between the shielding layer 5D and a color filter 24) and to be selectively exposed from the upper surface of the surface protective film 15, as in a photoelectric converter 121 shown in FIG. 20. Further, another shielding layer 5E may be covered to further pass through the color filter 24 and to be selectively exposed from the upper surface of the color filter 24, as in the photoelectric converter 121.

While the lower electrode layers 92 or 102 are completely embedded in the interlayer film 19 in each of the aforementioned seventh to ninth embodiments, the lower electrode layers may partially project upward beyond the front surface of the interlayer film 19.

Various types of circuit elements such as capacitors and resistors may be formed on the substrate 2, in addition to the CMOS field-effect transistor. The circuit elements may constitute an integrated circuit such as an SSI (Small Scale Integration), MSI (Medium Scale Integration), LSI (Large Scale Integration), VLSI (Very Large Scale Integration) or ULSI (Ultra-Very Large Scale Integration) circuit.

A plurality of photoelectric converters according to the present invention may be one-dimensionally arranged to be used as a line image sensor, or may be two-dimensionally arranged to be used as an area image sensor, for example.

The photoelectric converter according to the present invention is applicable to an image sensor such as a security camera (a camera sensing visible light in the daytime and sensing near infrared light in the nighttime), a personal identification camera (a camera for personal identification with near infrared light uninfluenced by external light) or an onboard camera (a camera loaded on a car for nightly visual assistance or an effective distant visual field), a medical image sensor for detecting near infrared light, a photodetector in a wide wave range, an avalanche photodiode or the like.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2012-135088 filed with the Japan Patent Office on Jun. 14, 2012, Japanese Patent Application No. 2012-181896 filed with the Japan Patent Office on Aug. 20, 2012, and Japanese Patent Application No. 2013-118090 filed with the Japan Patent Office on Jun. 4, 2013, the disclosures of which are incorporated herein by reference.

The following characteristics are graspable from the disclosure of the aforementioned embodiments:

(A1) A photoelectric converter including a substrate, a plurality of lower electrode layers arranged on the substrate, a compound semiconductor layer of a chalcopyrite structure arranged on the plurality of lower electrode layers to collectively cover the lower electrode layers and partitioned into a plurality of pixels, and a transparent electrode layer arranged on the compound semiconductor layer, wherein the lower electrode layers are formed by tungsten layers or molybdenum layers having a thickness of 50 nm to 200 nm.

According to the invention described in A1, the thickness of the lower electrode layers is 50 nm to 200 nm, whereby a step between the lower electrode layers and the substrate can be reduced. Therefore, an undepleted range in the compound semiconductor layer can be reduced. Consequently, crosstalk can be suppressed. Further, the compound semiconductor layer collectively covers the lower electrode layers, and is not separated every pixel. Therefore, no working for pixel separation may be performed when manufacturing the photoelectric converter, whereby manufacturing steps can be simplified. Further, the compound semiconductor layer can be prevented from damage resulting from such working. In addition, the thickness of the lower electrode layers can be reduced to 50 nm to 200 nm as hereinabove described, whereby a step between the compound semiconductor layer and the transparent electrode layer can be reduced. Consequently, formation of void defects can be suppressed in the space between the compound semiconductor layer and the transparent electrode layer. As a result, generation of dark current can be suppressed.

(A2) A photoelectric converter including a substrate, an insulating film arranged on the substrate, a plurality of lower electrode layers embedded in the insulating film, a compound semiconductor layer of a chalcopyrite structure arranged on the plurality of lower electrode layers to collectively cover the lower electrode layers and partitioned into a plurality of pixels, and a transparent electrode layer arranged on the compound semiconductor layer, wherein the lower electrode layers are formed by tungsten layers or molybdenum layers.

According to the invention described in A2, the lower electrode layers are embedded in the insulating film, whereby a step between the lower electrode layers and the insulating film can be reduced as compared with a case where the lower electrode layers are formed on the front surface of the insulating film. Therefore, an undepleted range in the compound semiconductor layer can be reduced. Consequently, crosstalk can be suppressed. Further, the compound semiconductor layer collectively covers the lower electrode layers, and is not separated every pixel. Therefore, no working for pixel separation may be performed when manufacturing the photoelectric converter, whereby manufacturing steps can be simplified. Further, the compound semiconductor layer can be prevented from damage resulting from such working. In addition, the lower electrode layers are embedded in the insulating film as hereinabove described, whereby a step between the compound semiconductor layer and the transparent electrode layer can be reduced. Consequently, formation of void defects can be suppressed in the space between the compound semiconductor layer and the transparent electrode layer. As a result, generation of dark current can be suppressed.

(A3) The photoelectric converter according to A2, wherein the lower electrode layers are completely embedded in the insulating film, so that the upper surfaces thereof are flush with the front surface of the insulating film.

According to the invention described in A3, the compound semiconductor layer can be completely depleted, whereby crosstalk can be reliably prevented. Further, the space between the compound semiconductor layer and the transparent electrode layer can be planarized, whereby formation of void defects can be more effectively suppressed in the space.

(A4) The photoelectric converter according to A2, wherein the lower electrode layers are completely embedded in the insulating film, so that the upper surfaces thereof are lower than the front surface of the insulating film.

According to the invention described in A4, the compound semiconductor layer can be completely depleted, whereby crosstalk can be reliably prevented.

(A5) The photoelectric converter according to any one of A2 to A4, wherein the lower electrode layers have a thickness of 50 nm to 200 nm.

(A6) The photoelectric converter according to any one of A1 to A5, further including a shielding layer arranged around each of the pixels on the compound semiconductor layer.

According to the invention described in A6, the shielding layer is arranged around each pixel. Thus, the shielding layer can block light incident in the vicinity of boundaries between the pixels, whereby the occurrence of crosstalk can be more excellently suppressed.

(A7) The photoelectric converter according to A6, wherein the width of the shielding layer is not more than 30% of the size of each of the pixels.

According to the invention described in A7, the aperture ratio of the compound semiconductor layer can be relatively increased and each pixel can obtain a sufficient signal, whereby the SN ratio (the signal-to-noise ratio) of the photoelectric converter can be increased.

(A8) The photoelectric converter according to A6 or A7, wherein the shielding layer is made of a material blocking light having a wavelength absorbable by a compound semiconductor of a chalcopyrite structure.

(A9) The photoelectric converter according to any one of A6 to A8, wherein the shielding layer is made of aluminum or black resist.

(A10) The photoelectric converter according to A9, including a metal electrode layer made of aluminum selectively formed on the transparent electrode layer and connected to the transparent electrode layer, and the shielding layer made of aluminum is formed on the front surface of the transparent electrode layer.

Both of the shielding layer and the metal electrode layer are made of aluminum and formed on the transparent electrode layer, whereby the shielding layer and the metal electrode layer can be formed through the same step. Consequently, manufacturing steps can be simplified.

(A11) The photoelectric converter according to any one of A6 to A10, wherein the shielding layer is formed over the whole periphery of a boundary between the pixels adjacent to each other in plan view.

(A12) The photoelectric converter according to A11, wherein the shielding layer has a constant width in a direction across the boundary.

(A13) The photoelectric converter according to A11, wherein the pixels are provided in the form of quadrangles in plan view, and the shielding layer has a relatively large width on a corner portion of the boundary between the pixels, and has a relatively small width on a side portion of the boundary between the pixels.

(A14) The photoelectric converter according to A13, wherein the shielding layer forms a circular region in an inner region thereof.

(A15) The photoelectric converter according to any one of A6 to A10, wherein the shielding layer is selectively formed on part of a boundary between the pixels adjacent to each other in plan view.

(A16) The photoelectric converter according to A15, wherein the pixels are provided in the form of quadrangles in plan view, and the shielding layer is formed only on a corner portion of the boundary between the pixels, and selectively exposes a side portion of the boundary between the pixels.

The corner portion of the boundary between the pixels is present on a position separating from the lower electrode layers in the pixels as compared with the side portion of the boundary between the pixels. Thus, light incident in the vicinity of the corner portion of the boundary more easily causes crosstalk as compared with light incident in the vicinity of the side portion of the boundary. Therefore, an effect of preventing crosstalk can be sufficiently attained by simply selectively forming the shielding layer only on the corner portion.

(A17) The photoelectric converter according to any one of A1 to A16, further including a microlens arranged on the transparent electrode layer.

According to the invention described in A17, the microlens can converge light incident upon the pixels on the lower electrode layers. Therefore, signals detected by the lower electrode layers can be increased.

(A18) The photoelectric converter according to A11, wherein the microlens overlaps the shielding layer in a lateral direction along the front surface of the substrate.

According to the invention described in A18, the microlens overlaps the shielding layer, whereby the quantity of luminous flux incident in the vicinity of the shielding layer can be reduced, and the occurrence of crosstalk can be more suppressed.

(A19) The photoelectric converter according to any one of A1 to A16, further including a color filter arranged on the transparent electrode layer.

(A20) The photoelectric converter according to A19, further including an infrared ray filter arranged to be adjacent to the color filter.

According to the invention described in A20, the color filter and the shielding layer are so combined with each other that color mixing resulting from crosstalk can be excellently prevented.

(A21) The photoelectric converter according to A19 or A20, further including a microlens arranged on the color filter.

According to the invention described in A21, the microlens can converge light incident upon the color filter on the lower electrode layers through the color filter. Therefore, color mixing can be more excellently prevented.

(A22) The photoelectric converter according to any one of A6 to A21, wherein the compound semiconductor layer is made of $Cu_y(In_xGa_{1-x})Se_2$ ($0 \leq y \leq 1$ and $0 \leq x \leq 1$).

(A23) The photoelectric converter according to any one of A6 to A22, including a circuit portion arranged between the substrate and the lower electrode layers.

According to the invention described in A23, the circuit portion and the compound semiconductor layer are so stacked with each other that most region of the front surface of the substrate can be effectively utilized as a photodetection surface. Therefore, a photoelectric converter capable of sufficiently ensuring a detection area can be designed, whereby sensitivity thereof can be improved.

(A24) The photoelectric converter according to A23, wherein the circuit portion includes a CMOS field-effect transistor.

(A25) The photoelectric converter according to A24, wherein the CMOS field-effect transistor includes a source layer and a drain layer selectively formed on a surface portion of the substrate and a gate electrode arranged between the source layer and the drain layer.

(A26) The photoelectric converter according to any one of A1 to A25, wherein the transparent electrode layer is made of zinc oxide (ZnO) or indium tin oxide (ITO).

(A27) The photoelectric converter according to any one of A6 to A26, including a buffer layer arranged between the compound semiconductor layer and the transparent electrode layer.

(A28) The photoelectric converter according to A27, wherein the buffer layer is made of CdS, ZnS, $(Cd_xZn_{1-x})S$ $(0 \leq x \leq 1)$, ZnO, Zn (O, OH)S, $(Zn_zMg_{1-z})O$ $(0 \leq z \leq 1)$, ZnSe or $In_2S_3$.

What is claimed is:

1. A photoelectric converter comprising:
   a substrate;
   a lower electrode layer arranged on the substrate;
   a compound semiconductor layer of a chalcopyrite structure arranged on the lower electrode layer to cover the lower electrode layer and partitioned into a plurality of pixels;
   a transparent electrode layer arranged on the compound semiconductor layer;
   a shielding layer arranged around each of the pixels on the compound semiconductor layer; and
   a metal electrode layer made of aluminum selectively formed on the transparent electrode layer and connected to the transparent electrode layer, wherein
   the shielding layer is made of aluminum or black resist, and
   the shielding layer made of aluminum is formed on the transparent electrode layer.

2. The photoelectric converter according to claim 1, wherein the width of the shielding layer is 1% to 30% of the size of each of the pixels.

3. The photoelectric converter according to claim 1, wherein the shielding layer is made of a material blocking light having a wavelength absorbable by a compound semiconductor of a chalcopyrite structure.

4. The photoelectric converter according to claim 1, wherein the shielding layer is selectively formed on part of a boundary between the pixels adjacent to each other in plan view.

5. The photoelectric converter according to claim 4, wherein
   the pixels are provided in the form of quadrangles in plan view, and
   the shielding layer is formed only on a corner portion of the boundary between the pixels, and selectively exposes a side portion of the boundary between the pixels.

6. The photoelectric converter according to claim 1, further comprising a microlens arranged on the transparent electrode layer.

7. The photoelectric converter according to claim 6, wherein the microlens overlaps the shielding layer in a lateral direction along a front surface of the substrate.

8. The photoelectric converter according to claim 1, further comprising a color filter arranged on the transparent electrode layer.

9. The photoelectric converter according to claim 8, further comprising an infrared ray filter arranged to be adjacent to the color filter.

10. The photoelectric converter according to claim 8, further comprising a microlens arranged on the color filter.

11. The photoelectric converter according to claim 1, wherein the compound semiconductor layer is made of $Cu_Y(In_XGa_{1-X})Se_2$ $(0 \leq Y \leq 1$ and $0 \leq X \leq 1)$.

12. The photoelectric converter according to claim 1, comprising a circuit portion arranged between the substrate and the lower electrode layer.

13. The photoelectric converter according to claim 12, wherein the circuit portion includes a CMOS field-effect transistor.

14. The photoelectric converter according to claim 13, wherein the CMOS field-effect transistor includes a source layer and a drain layer selectively formed on a surface portion of the substrate and a gate electrode arranged between the source layer and the drain layer.

15. The photoelectric converter according to claim 1, wherein the transparent electrode layer is made of zinc oxide (ZnO) or indium tin oxide (ITO).

16. The photoelectric converter according to claim 1, comprising a buffer layer arranged between the compound semiconductor layer and the transparent electrode layer.

17. The photoelectric converter according to claim 16, wherein the buffer layer is made of CdS, ZnS, $(Cd_XZn_{1-X})S$ $(0 \leq X \leq 1)$, ZnO, Zn(O, OH)S, $(Zn_ZMg_{1-Z})O$ $(0 \leq Z \leq 1)$, ZnSe or $In_2S_3$.

18. The photoelectric converter according to claim 1, wherein the lower electrode layer is made of molybdenum (Mo), niobium (Nb), tantalum (Ta) or tungsten (W).

19. The photoelectric converter according to claim 1, wherein
   the compound semiconductor layer is arranged to collectively cover a plurality of lower electrode layers, and
   the lower electrode layers are formed by tungsten layers or molybdenum layers having a thickness of 50 nm to 200 nm.

20. A photoelectric converter comprising:
   a substrate;
   a lower electrode layer arranged on the substrate;
   a compound semiconductor layer of a chalcopyrite structure arranged on the lower electrode layer to cover the lower electrode layer and partitioned into a plurality of pixels;
   a transparent electrode layer arranged on the compound semiconductor layer; and
   a shielding layer arranged around each of the pixels on the compound semiconductor layer, wherein
   the shielding layer is formed over the whole periphery of a boundary between the pixels adjacent to each other in plan view,
   the pixels are provided in the form of quadrangles in plan view, and
   the shielding layer has a relatively large width on a corner portion of the boundary between the pixels, and has a relatively small width on a side portion of the boundary between the pixels.

21. The photoelectric converter according to claim 20, wherein the shielding layer forms a circular region in an inner region thereof.

22. A photoelectric converter comprising:
   a substrate;
   a lower electrode layer arranged on the substrate;
   a compound semiconductor layer of a chalcopyrite structure arranged on the lower electrode layer to cover the lower electrode layer and partitioned into a plurality of pixels;
   a transparent electrode layer arranged on the compound semiconductor layer; and
   a shielding layer arranged around each of the pixels on the compound semiconductor layer;
   wherein the compound semiconductor layer is arranged to collectively cover a plurality of lower electrode layers;
   wherein the shielding layer is formed over the whole periphery of a boundary between the pixels adjacent to each other in plan view to straddle one side of the boundary and another side thereof;
   wherein the pixels are provided in the form of quadrangles in plan view; and wherein the shielding layer has a substantially constant width in a direction across the boundary.

23. A photoelectric converter comprising:
a substrate;
a lower electrode layer arranged on the substrate;
a compound semiconductor layer of a chalcopyrite structure arranged on the lower electrode layer to cover the lower electrode layer and partitioned into a plurality of pixels;
a transparent electrode layer arranged on the compound semiconductor layer;
a shielding layer arranged around each of the pixels on the compound semiconductor layer; and
an insulating film arranged between the substrate and the lower electrode layer;
wherein the compound semiconductor layer is arranged to collectively cover a plurality of lower electrode layers;
wherein the lower electrode layers are formed by metal layers being at least one kind selected from the group consisting of molybdenum (Mo), niobium (Nb), tantalum (Ta) and tungsten (W) and the metal layers are disposed on the insulating film or embedded in the insulating film; and
wherein the shielding layer is formed over the whole periphery of a boundary between the pixels adjacent to each other in plan view to straddle one side of the boundary and another side thereof.

24. The photoelectric converter according to claim 23, wherein the lower electrode layers are completely embedded in the insulating film, so that the upper surfaces thereof are flush with a front surface of the insulating film.

25. A photoelectric converter comprising:
a substrate;
a lower electrode layer arranged on the substrate;
a compound semiconductor layer of a chalcopyrite structure arranged on the lower electrode layer to cover the lower electrode layer and partitioned into a plurality of pixels;
a transparent electrode layer arranged on the compound semiconductor layer;
a shielding layer arranged around each of the pixels on the compound semiconductor layer; and
an insulating film arranged between the substrate and the lower electrode layer;
wherein the compound semiconductor layer is arranged to collectively cover a plurality of lower electrode layers;
wherein the lower electrode layers are formed by metal layers being at least one kind selected from the group consisting of molybdenum (Mo), niobium (Nb), tantalum (Ta) and tungsten (W) and the metal layers are disposed on the insulating film or embedded in the insulating film; and
wherein the lower electrode layers are completely embedded in the insulating film, so that the upper surfaces thereof are lower than a front surface of the insulating film.

26. A photoelectric converter comprising:
a substrate;
a lower electrode layer arranged on the substrate;
a compound semiconductor layer of a chalcopyrite structure arranged on the lower electrode layer to cover the lower electrode layer and partitioned into a plurality of pixels;
a transparent electrode layer arranged on the compound semiconductor layer;
a shielding layer arranged around each of the pixels on the compound semiconductor layer; and
an insulating film arranged between the substrate and the lower electrode layer;
wherein the compound semiconductor layer is arranged to collectively cover a plurality of lower electrode layers;
wherein the lower electrode layers are formed by metal layers being at least one kind selected from the group consisting of molybdenum (Mo), niobium (Nb), tantalum (Ta) and tungsten (W) and the metal layers are disposed on the insulating film or embedded in the insulating film; and
wherein the lower electrode layers have a thickness of 50 nm to 200 nm.

* * * * *

UNITED STATES PATENT AND TRADEMARK OFFICE
CERTIFICATE OF CORRECTION

PATENT NO. : 8,963,272 B2  
APPLICATION NO. : 13/918042  
DATED : February 24, 2015  
INVENTOR(S) : Takuji Maekawa, Osamu Matsushima and Toshihisa Maeda Page 1 of 1

It is certified that error appears in the above-identified patent and that said Letters Patent is hereby corrected as shown below:

Title Page:  
Item (30), Foreign Application Priority Data should read as follows:

-- Jun. 14, 2012 (JP) 2012-135088  
   Aug. 20, 2012 (JP) 2012-181896  
   Jun. 04, 2013 (JP) 2013-118090 --

Signed and Sealed this  
Ninth Day of June, 2015

Michelle K. Lee  
*Director of the United States Patent and Trademark Office*